United States Patent
Bach et al.

(10) Patent No.: US 6,335,480 B1
(45) Date of Patent: Jan. 1, 2002

(54) PHOTOVOLTAIC CELL

(75) Inventors: Udo Bach, Renens; Michael Grätzel, St.-Sulpice, both of (CH); Josef Salbeck, Kelkheim (DE); Frank Weissörtel, Neuburg an der Donau (DE); Donald Lupo, Frankfurt (DE)

(73) Assignee: Aventis Research & Technologies GmbH & Co., Frankfurt am Main (DE)

( * ) Notice: Subject to any disclaimer, the term of this patent is extended or adjusted under 35 U.S.C. 154(b) by 0 days.

(21) Appl. No.: 09/381,192
(22) PCT Filed: Mar. 18, 1998
(86) PCT No.: PCT/EP98/01558
  § 371 Date: Nov. 24, 1999
  § 102(e) Date: Nov. 24, 1999
(87) PCT Pub. No.: WO98/48433
  PCT Pub. Date: Oct. 29, 1998

(30) Foreign Application Priority Data

Mar. 20, 1997 (DE) ............................................. 197 11 713

(51) Int. Cl.$^7$ .................................................. H01L 31/00
(52) U.S. Cl. .............................................. 136/263; 429/111
(58) Field of Search ............................. 136/263; 429/111

(56) References Cited

U.S. PATENT DOCUMENTS

| 5,084,365 A | 1/1992 | Gratzel et al. ................ 429/111 |
| 5,840,217 A | 11/1998 | Lupo et al. .................... 252/583 |
| 5,885,368 A | 3/1999 | Lupo et al. .................... 136/263 |

FOREIGN PATENT DOCUMENTS

| EP | 0 333 641 A1 | 9/1989 |
| EP | 0 676 461 A2 | 10/1995 |
| WO | WO 97/10617 | 3/1997 |

Primary Examiner—Mark Chapman
(74) Attorney, Agent, or Firm—Frommer Lawrence & Haug LLP

(57) ABSTRACT

A photovoltaic cell comprising an electrolyte which comprises a hole conductor compound as redox system.

14 Claims, 2 Drawing Sheets

PHOTOVOLTAIC CELL

Figure 1:
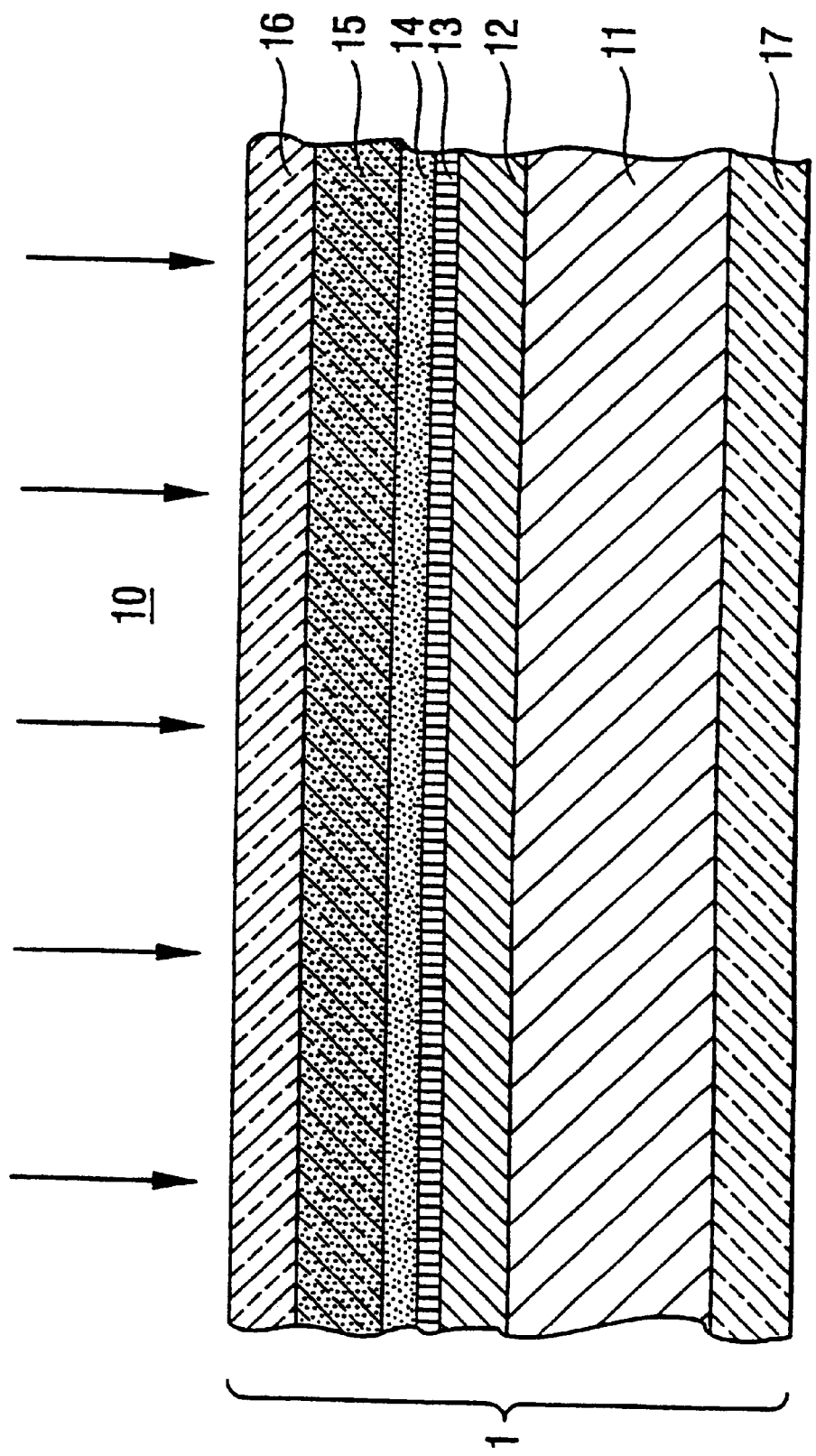

Owing to the rising world demand for electric energy and the limited reserves of coal, oil and gas, which in addition liberate the greenhouse gas $CO_2$ on combustion, the generation of electric power from sunlight has attracted increased interest in recent years.

A photovoltaic cell is a component in which light is converted directly into electric energy. In addition to two electrodes, it comprises at least one light-absorbing layer and a charge transport layer. If the light is sunlight, one speaks of a solar cell. Although the photovoltaic effect, i.e. the generation of an electric potential across a pn junction on irradiation with light, was observed by Becquerel as early as 1893, the first functional solar cells were only able to be produced with the development of semiconductor technology in the 1940s and 1950s. Since the voltage of a single solar cell is generally small (typically <1V), cells are usually connected in series to form modules.

The solar cells used nowadays usually comprise a semiconductor material, in most cases silicon, as light-absorbing layer. However, the silicon used in this application has to meet very high demands in respect of purity and quality of processing. As a result, solar cells are at present not competitive for many applications for cost reasons.

In contrast, a dye-sensitized solar cell developed in the 1960s by H. Tributsch uses a material having a very large band gap, e.g. titanium dioxide, as semiconductor. Such a semiconductor absorbs little sunlight, for which reason a dye (chromophore) is applied to the semiconductor.

If a dye molecule absorbs a photon, this causes excitation of an electron into the lowest unoccupied molecular orbital. From this, it can then be injected into the conduction band of the semiconductor. The semiconductor thus serves predominantly for the transport of electrons. For this purpose, no particular purity and perfection of the material is necessary. The semiconductor layer can, for example, simply be painted from a powder suspension onto conductive glass. EP-A 0 333 641 describes a photoelectrochemical cell which comprises a nanoporous metal oxide semiconductor, i.e. a semiconductor having an extremely roughened surface and thus an increased surface area. In this cell, charge transport between semiconductor/chromophore layer and counter-electrode occurs through an electrolyte solution. Although good results are achieved using such cells, the property profile of such a device is still capable of considerable improvement. The electron is returned to the dye by diffusion of ions. As a result, the only suitable redox systems are those which are small enough to penetrate into the pores of the nanocrystalline semiconductor layer. In the best redox system up to the present time, viz. $I^-/I_3^-$, about 40% of the energy which is theoretically available is lost as heat because of poor matching of the energy levels between dye and redox system, and the efficiency of energy conversion is limited to about 10% in direct sunlight. A further disadvantage of this redox system is that the chemically aggressive triiodide places extreme demands on sealing materials and also on insulators and conductors which are necessary for connecting the cells in series in modules. This disadvantage means that it is very difficult to produce stable cells and modules and that the production costs increase because of the complicated sealing technique.

It has now surprisingly been found that the above described disadvantages can be reduced if the electrolyte comprising the $I^-/I_3^-$ redox system in the above-described cell is replaced by an electrolyte in which a hole conductor compound assumes the role of the redox system.

The invention accordingly provides a photovoltaic cell comprising an electrolyte which comprises a hole conductor compound as redox system. The redox system preferably consists of one or more hole conductor compounds. The use of a hole conductor compound in place of $I^-/I_3^-$ enables the energy levels of redox system and dye to be matched more closely so as to make possible better utilization of the absorbed energy so that the efficiency for sunlight can be improved. In addition, replacement of the aggressive triodide by hole conductor compounds makes it possible to use less expensive sealing layers and insulators and conductors and also makes possible simpler production processes for cells and modules.

Figure 2:
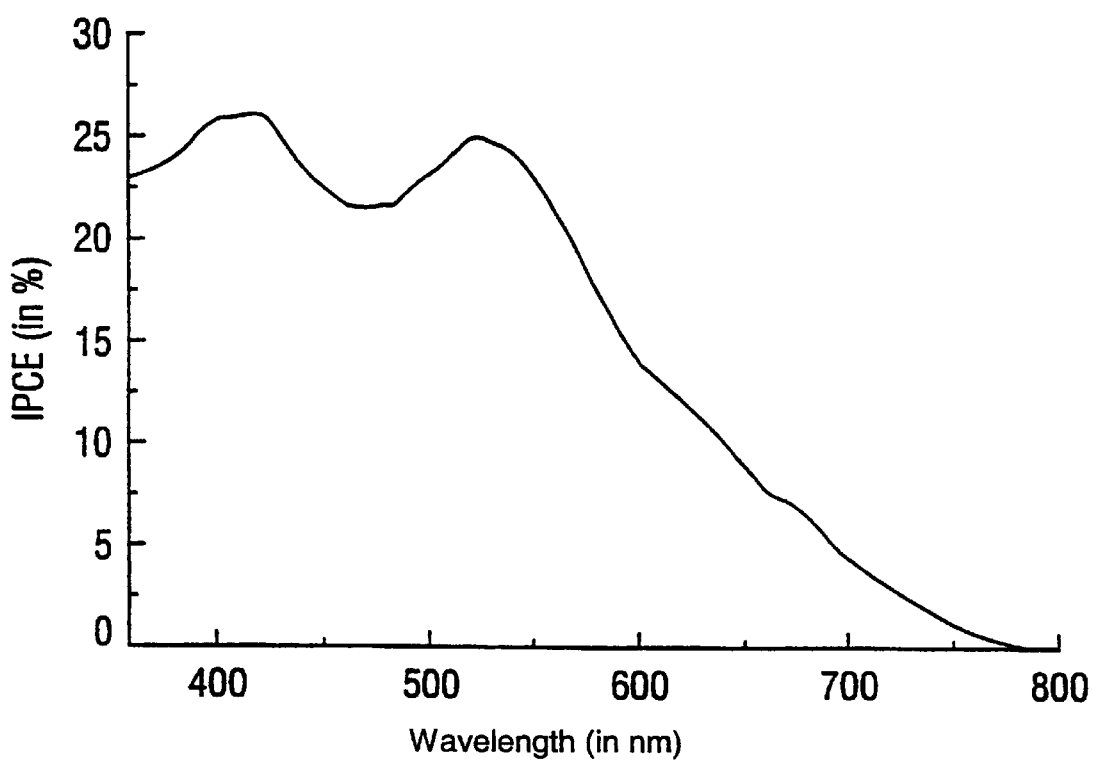

Reference will be made to the accompanying drawings, wherein:

FIG. 1 is a cross-sectional view of a preferred embodiment in accordance with the present invention; and FIG. 2 is an incident photon to current conversion efficiency (IPCE) curve of an embodiment of the instant invention comparing IPCE in percent with wavelength in nanometers.

FIG. 1 shows a preferred embodiment of the cell 1 of the invention (not to scale). A conductive support 11, which can serve as electrode or contact and, for example, conprises a metal or indium-tin oxide (ITO), has applied to it a semiconductor 12 which preferably has a surface having a roughness factor of >1 as light-absorbing layer. The cell of the invention preferably has a chromophore, here shown as chromophore layer 13, on the surface of the semiconductor. For the purposes of the present invention, the term light-absorbing layer encompasses both a semiconductor layer and a combination of semiconductor/chromophore, even if in this case the chromophore is almost entirely responsible for the actual absorption. This is adjoined by the electrolyte 14 which, according to the invention, comprises a hole conductor compound. It is bounded on one side by a counterelectrode 15 which can comprise, for example, a conductive glass, conductively coated plastic, metal or another conductive, preferably translucent, material. The cell 1 is sealed at the top and bottom by insulating layers 16 and 17. It can comprise a lateral closure not shown in the figure, for example a frame of electrically insulating material such as plastic or glass. At least one side of the cell has to allow the light to be converted into electric energy to pass through so that it can reach the chromophore or the semiconductor.

The cell of the invention additionally has devices for taking off the electric current generated by the cell (not shown in the figure).

For the purposes of the present invention, a hole conductor is a material which can conduct a positive charge resulting from the absence of an electron, thus decoupling mass transport and charge transport in the solid state. In the cell of the invention, the hole conductor material used according to the invention is present as a solution in the electrolyte liquid and charge transport occurs by diffusion of the neutral or oxidized forms of the hole conductor.

An overview of the state of the art for hole conductors may be found in *Encyclopedia of Chemical Technology* 18 (1996), pp. 837–860.

Generally suitable hole conductors are electron-rich, preferably organic, compounds which are oxidizable, preferably reversibly. It is generally assumed that charge transport in an organic hole conductor material occurs via the formation of free-radical cations.

The oxidation potential can here be varied over a wide range and can be matched to the specific energy levels of the semiconductor or sensitizer. The first oxidation potential preferably lies between the energy level of the ground state and 700 mV, preferably 400 mV, particularly preferably 300 mV, above the ground state.

Preference is given to hole conductor compounds which are soluble in organic or inorganic solvents. Examples of organic solvents, to which, however, the invention is not restricted, are chloroform, benzene, chlorobenzene, cyclohexanone, toluene, tetrahydrofuran, anisole, cresol, xylene, methyl lactate, methylene chloride, hexane, nitrile compounds or other aliphatic, aromatic or alcoholic solvents, with preference also being given to fully or partially fluorinated forms. For producing a hole conductor layer according to the invention, it is sufficient for the hole conductor material to be soluble in an appropriate solvent. For the purposes of the present invention, soluble means a solubility of at least 1.0 g/l at 25° C. in an organic or inorganic solvent, preferably in one of the abovementioned solvents.

Furthermore, particular preference is given to hole conductor materials which owing to their size can diffuse into the pores of a rough semiconductor layer.

For this purpose, preference is given to using, as redox system, hole conductor compounds which have molecular dimensions comparable to those of any sensitizer (chromophore) molecules used so that the molecules can come into close contact with the sensitizer molecules located in the pores of the semiconductor surface. The hole conductor molecules are particularly preferably less than 20 times, very particularly preferably less than 10 times, the size of corresponding sensitizer molecules.

Examples of organic hole conductors, to which the invention is not restricted, are triphenylmethanes, carbazoles and N,N'-diphenyl-N,N'-bis(3-methylphenyl)-(1,1-biphenyl)-4,4'-diamine (TPD).

As hole conductors, preference is given to Spiro and heterospiro compounds of the forrmula (I),

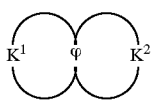
(I)

where

Ψ is C, Si, Ge or Sn, preferably C, Si or Ge, particularly preferably C or Si, very particularly preferably C, and $K^1$ and $K^2$ are, independently of one another, conjugate systems.

Spiro compounds are compounds in which two ring systems are linked by a single, tetravalent atom. This atom is referred to as the Spiro atom, as is explained in Handbook of Chemistry and Physics 62$^{nd}$ ed. (1981–2), CRC Press, pages C-23 to C-25. For the purposes of the present invention, the term Spiro compound refers to monomeric and polymeric carbospiro and heterospiro compounds.

Preferred compounds of the formula (I) are 9,9'-spirobifluorene derivates of the formula (II),

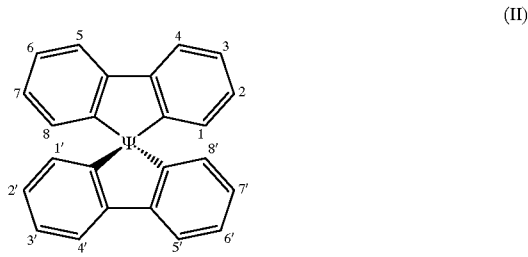
(II)

where Ψ is as defined above and the benzo groups can be, independently of one another, substituted and/or fused.

Particular preference is given to spirobifluorene derivatives of the formula (III),

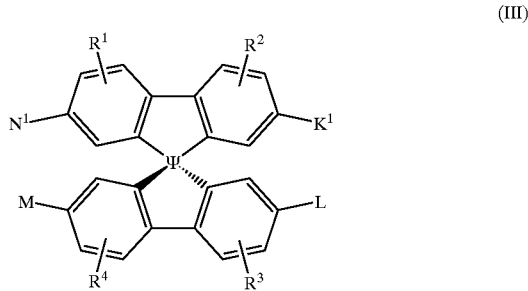
(III)

where the symbols and indices have the following meanings:

Ψ is C, Si, Ge or Sn, preferably C, Si, Ge, particularly preferably C, Si, very particularly preferably C, $K^1$, L, M, $N^1$, $R^1$, $R^2$, $R^3$, $R^4$ are identical or different and are each a) hydrogen, $NO_2$, —CN, —F or —Cl, b) a straight-chain or branched alkyl radical having from 1 to 20 carbon atoms, where b1) one or more nonadjacent $CH_2$ groups can be replaced by —O—, —S—, —CO—O—, —O—CO—, —O—CO—O—, $NR^5$ or —Si($CH_3$)$_2$— and/or b2) one or more $CH_2$ groups can be replaced by —CH=CH—, —C≡C—, 1,4-phenylene, 1,4-cyclohexylene or 1,3-cyclopentylene and/or b3) one or more H atoms can be replaced by F and/or Cl, and/or c) one of the following groups:

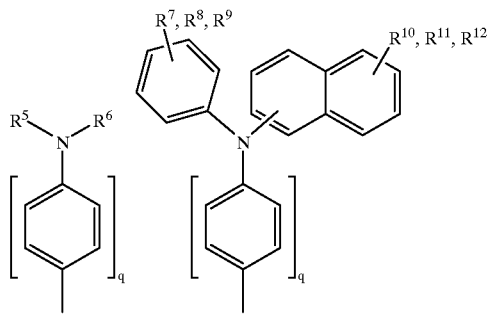

-continued
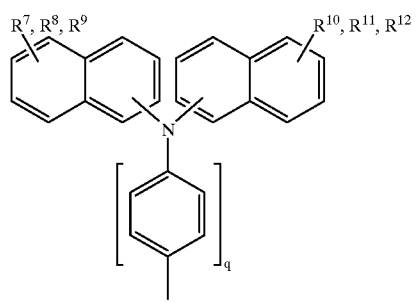
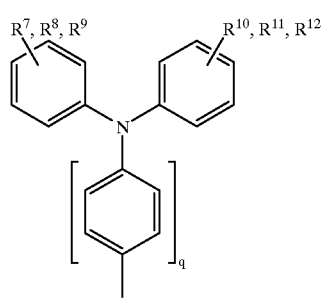
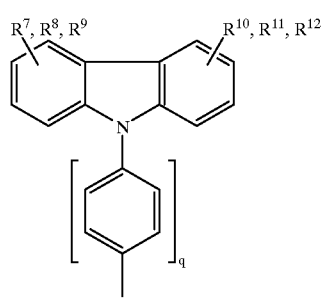
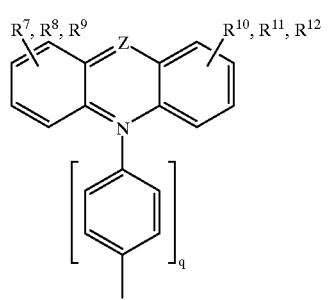
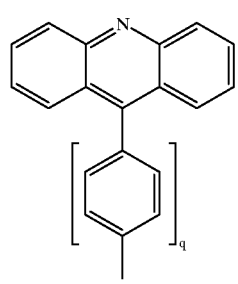
-continued
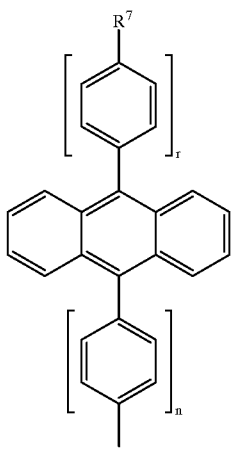
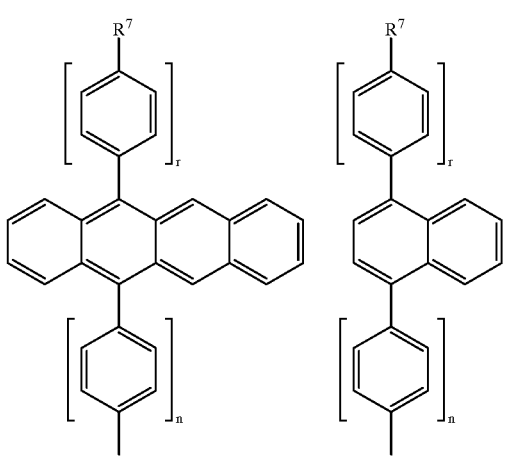
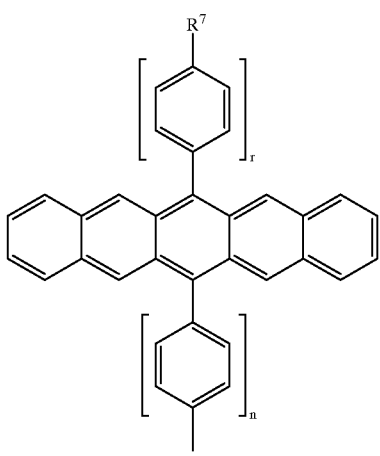
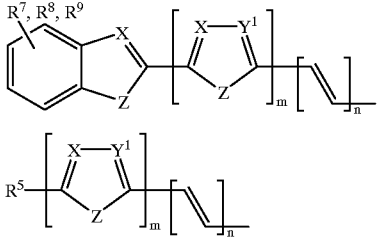

-continued

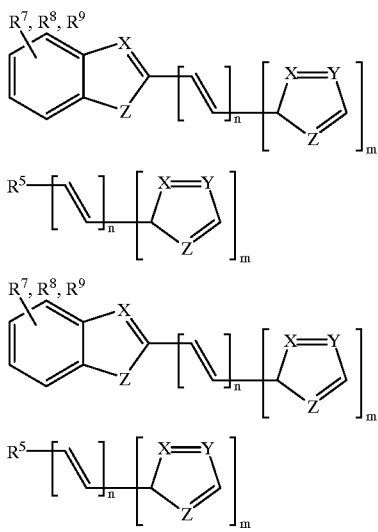

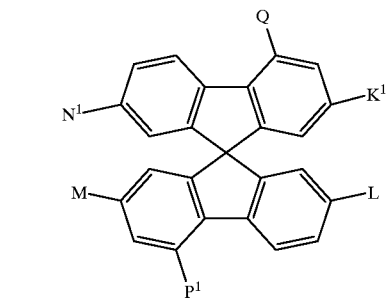

where the symbols have the following meanings:

IV.a) $K^1=L=M=N^1=$

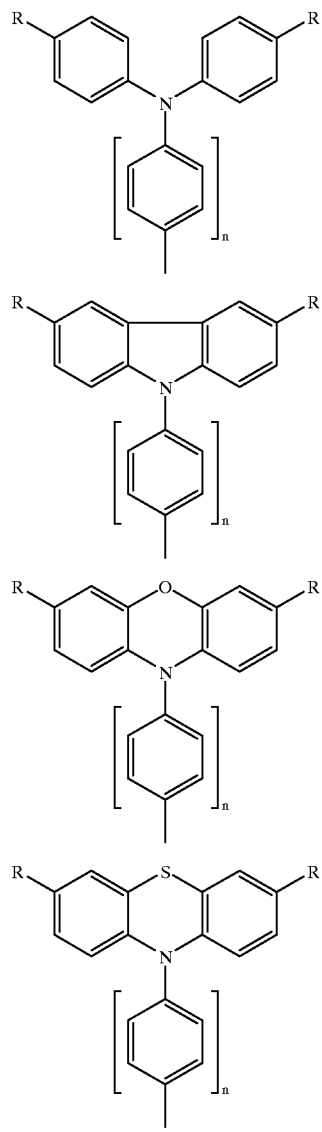

X, $Y^1$ are in each case identical or different and are =CR$^7$— or =N—;

Z is —O—, —S—, —NR$^5$—, —CRR—, —CR=CR— or —CR=N—;

$R^5$, $R^6$ are in each case identical or different and are each
a) hydrogen
b) a straight-chain or branched alkyl radical having from 1 to 20 carbon atoms, where
  b1) one or more nonadjacent CH$_2$ groups which are not bound to nitrogen can be replaced by —O—, —S—, —CO—O—, —O—CO—, —O—CO—O— or —Si(CH$_3$)$_2$— and/or
  b2) one or more CH$_2$ groups can be replaced by —CH=CH—, —C≡C—, cyclopropane-1,2-diyl, 1,4-phenylene, 1,4-cyclohexylene or 1,3-cyclopentylene and/or
  b3) one or more H atoms can be replaced by F and/or Cl and/or
  b4) $R^5$ and $R^6$ can together also form a ring;
c) phenyl, biphenyl, 1-naphthyl, 2-thienyl, 2-furanyl;

$R^7$, $R^8$, $R^9$, $R^{10}$, $R^{11}$, $R^{12}$ are identical or different and are each
a) hydrogen, —CN, —F, NO$_2$ or —Cl,
b) a straight-chain or branched alkyl radical having from 1 to 20 carbon atoms, where
  b1) one or more nonadjacent CH$_2$ groups can be replaced by —O—, —S—, —CO—O—, —O—CO—, —O—CO—O—, —NR$^5$ or —Si(CH$_3$)$_2$— and/or
  b2) one or more CH$_2$ groups can be replaced by —CH=CH—, —C≡C—, cyclopropane-1,2-diyl, 1,4-phenylene, 1,4-cyclohexylene or 1,3-cyclopentylene and/or
  b3) one or more H atoms can be replaced by F and/or Cl;
c) phenyl, biphenyl, 1-naphthyl, 2-naphthyl, 2-thienyl, 2-furanyl, —O-phenyl, —O-biphenyl, —O—1-naphthyl, —O-2-naphthyl, —O-2-thienyl, —O-2-furanyl;

m, n, p, q, r are in each case identical or different and are 0, 1, 2, 3, 4, 5 or 6, preferably 0, 1, 2, 3, 4, particularly preferably 0, 1, 2 or 3.

Very particular preference is given to spirobifluorene derivatives of the formulae (IV) a–c

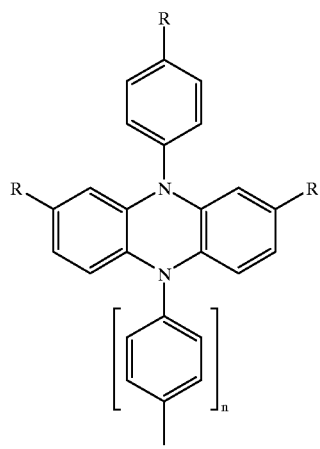

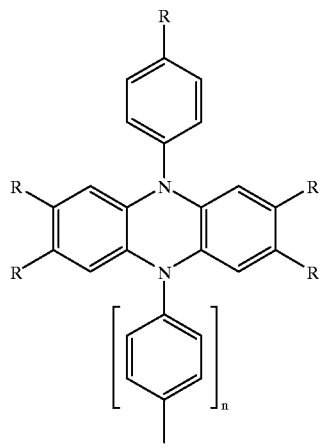

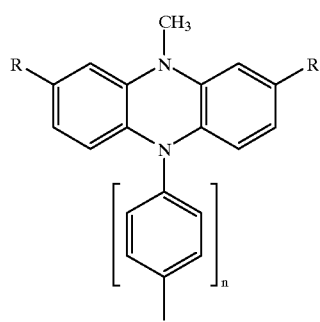

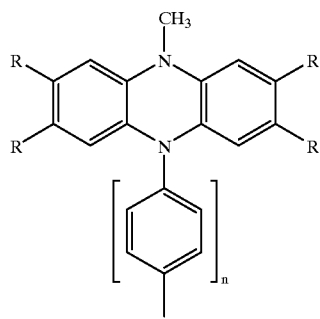

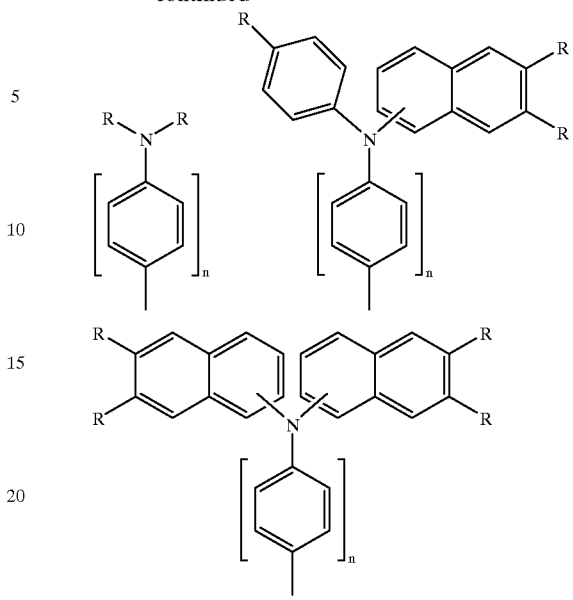

R are identical or different and are H, alkyl, —O-alkyl, —S-alkyl, each having from 1 to 20 carbon atoms, preferably from 1 to 4 carbon atoms, phenyl, biphenyl, —O-1-naphthyl, —O-2-naphthyl, —O-2-thienyl, —O-2-furanyl, —O-phenyl, —O-biphenyl, —O-1-naphthyl, —O-2naphthyl, —O-2-thienyl, —O-2-furanyl, —CN, $NR_2^+$, where O-alkyl/aryl, S-alkyl/aryl, CN and $NR_2$ must not be bound to nitrogen;

n=0,1,2,3,4;

and Q, $P^1$ are identical or different and are selected from the group consisting of:

H, COOR, CH$_2$OR,

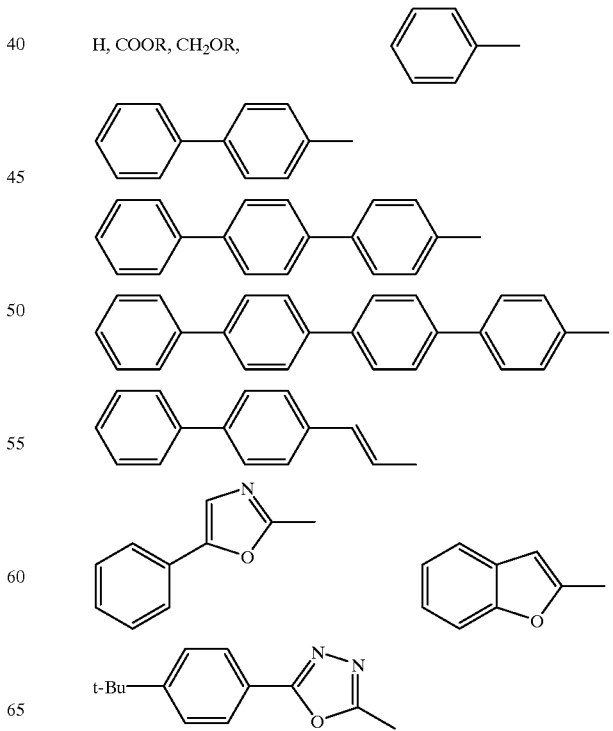

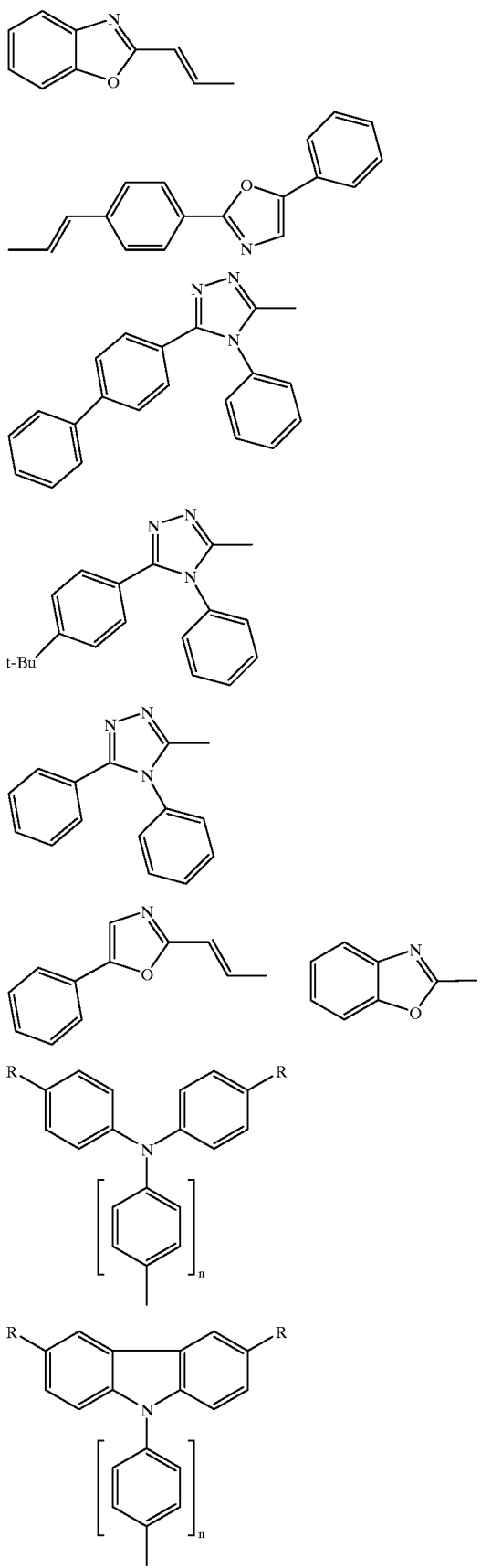
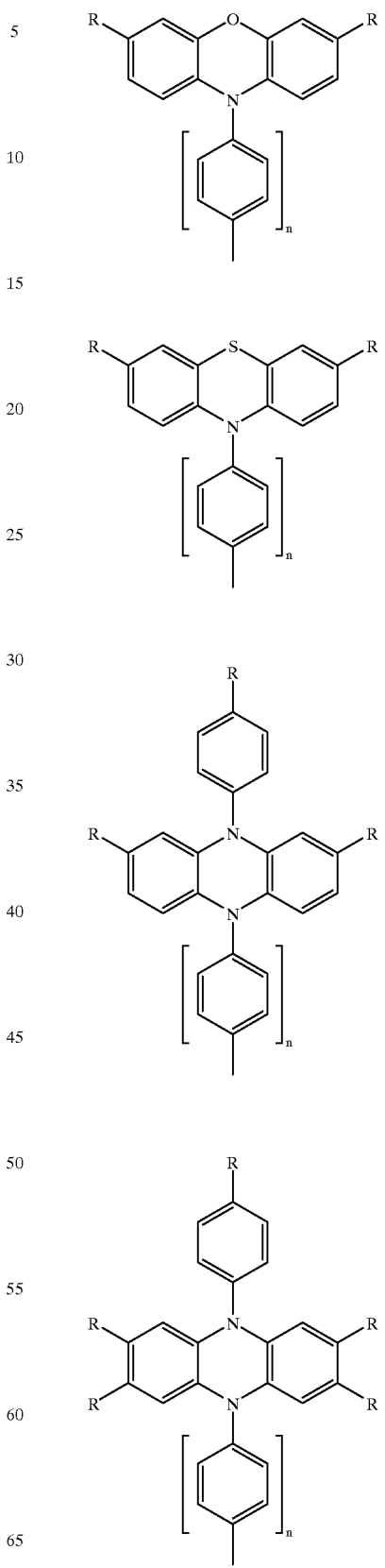

-continued
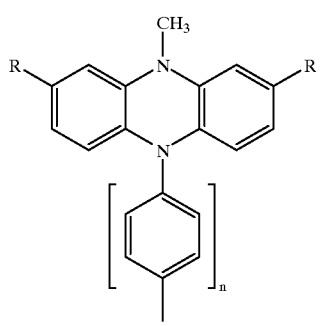
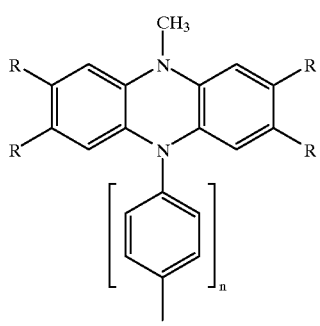
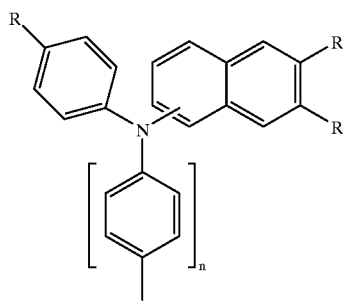
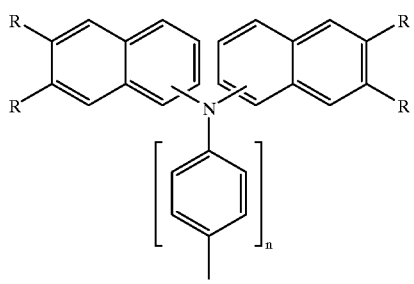
where the symbols and indices are as defined above;
IV.b) $K^1=N^1$ and is selected from the group consisting of:
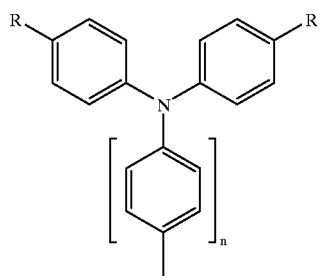
-continued
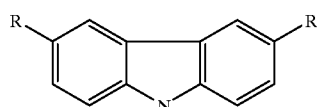
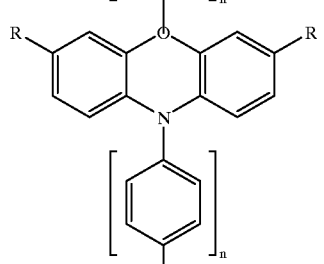
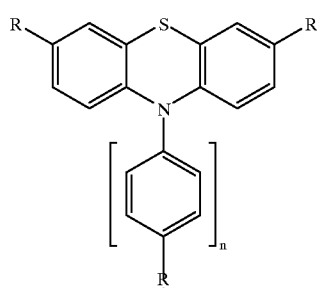
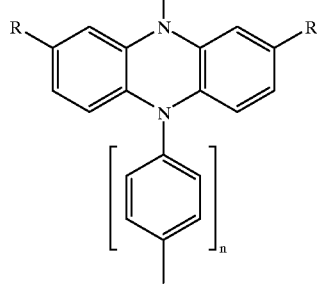
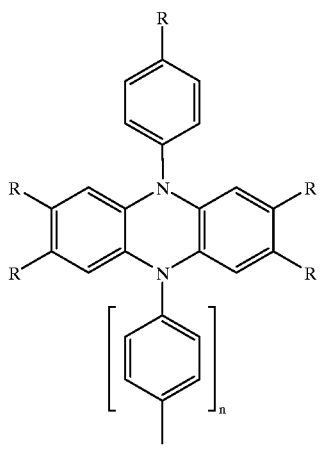

-continued
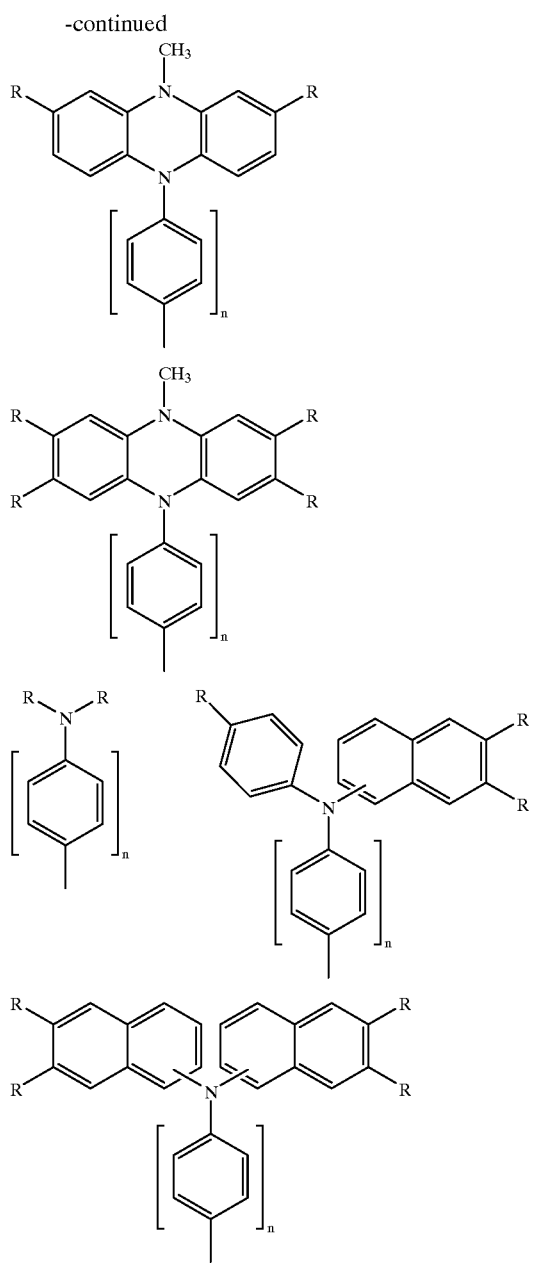
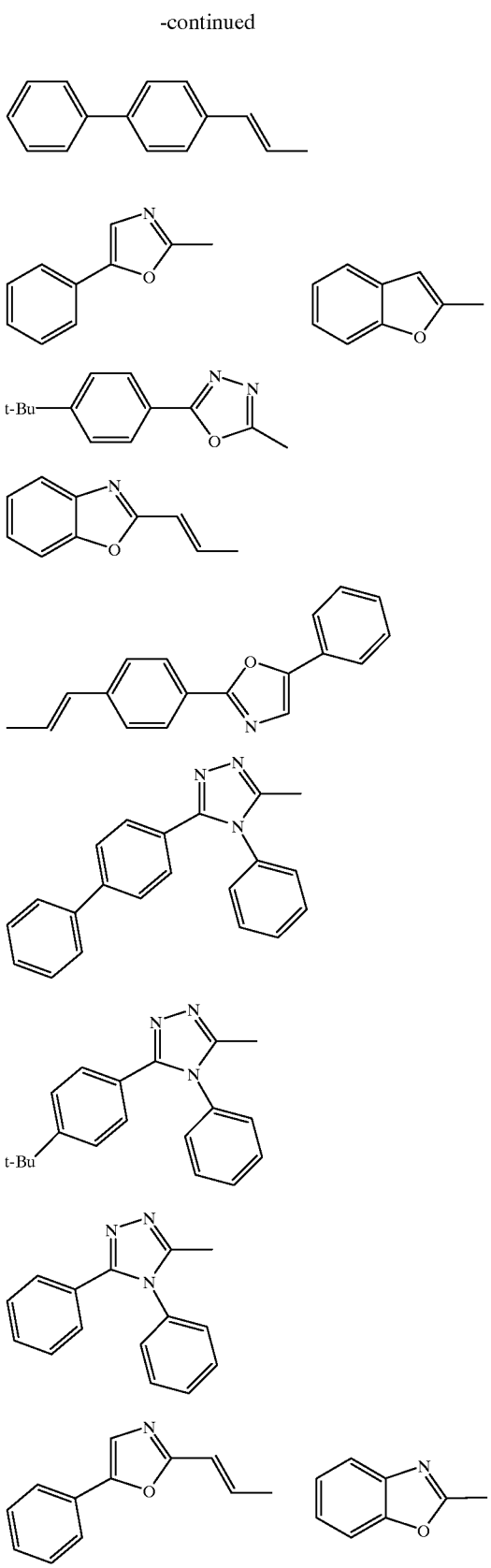
and L=M and is selected from the group consisting of:
H, COOR, CH$_2$OR,
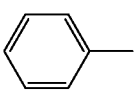
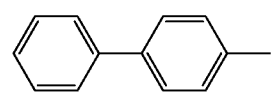
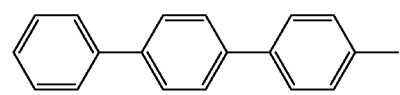
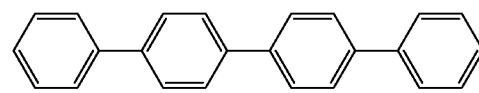
and Q, P$^1$ are identical or different and are selected from the group consisting of:

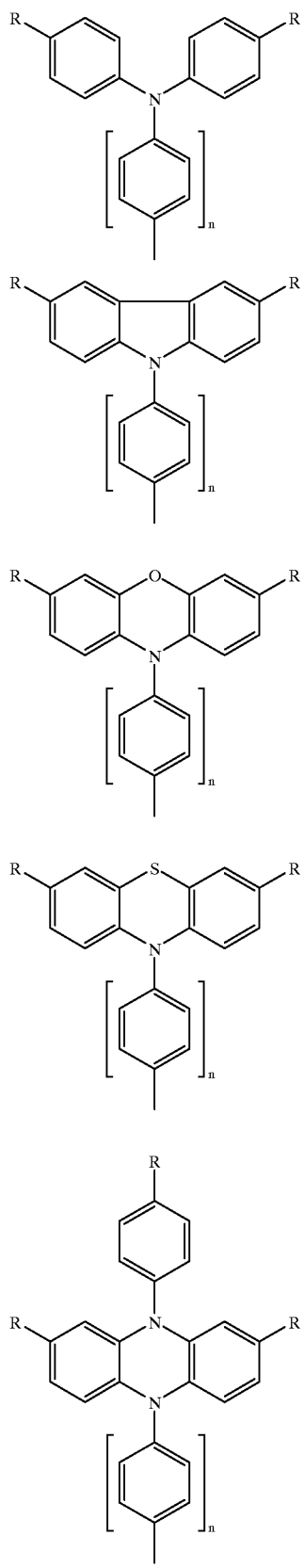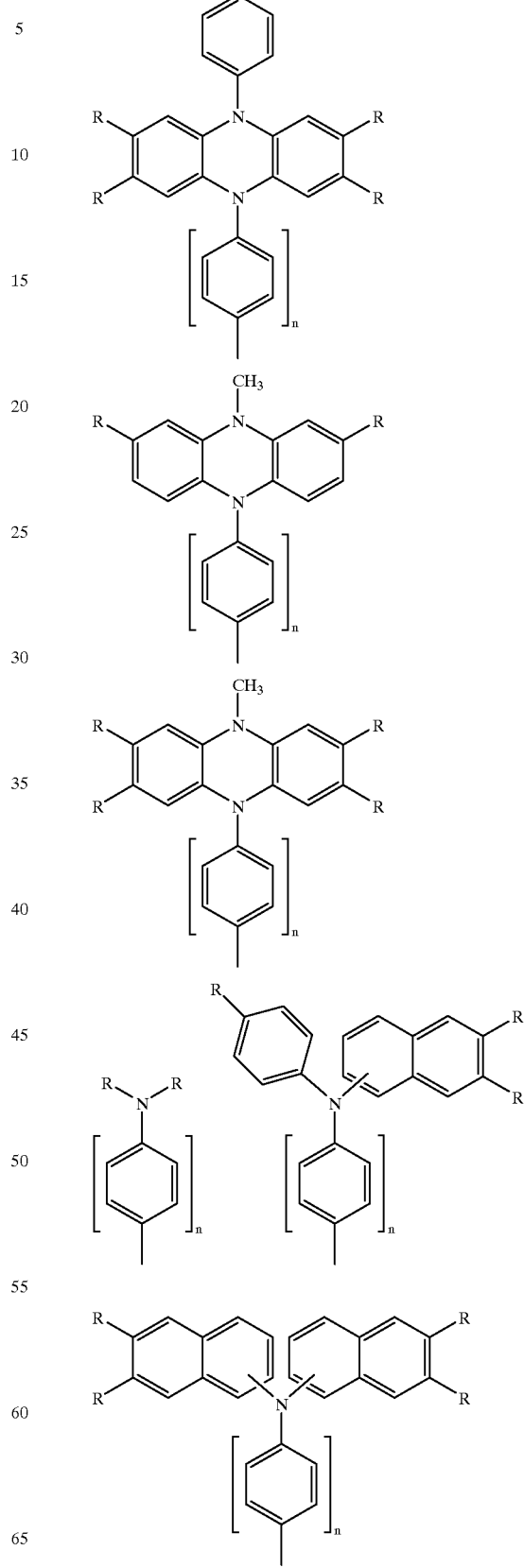

-continued
H, COOR, CH₂OR,
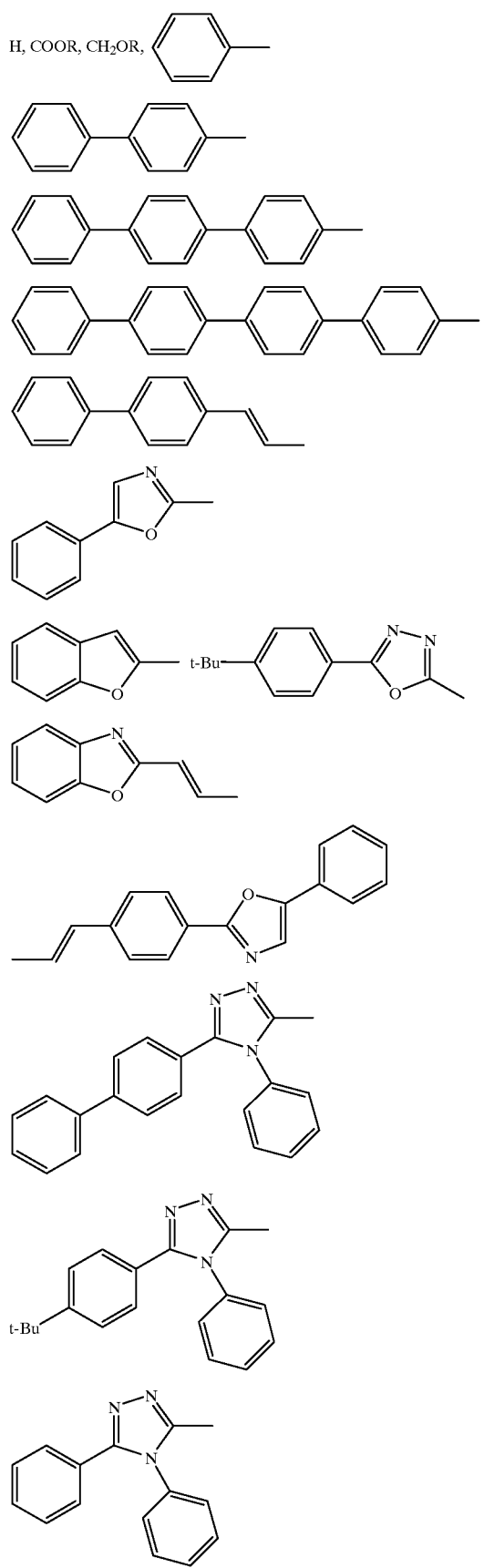
-continued
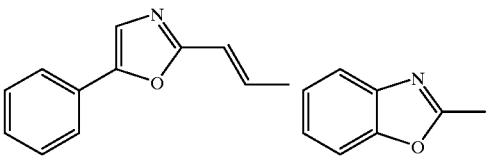
where the symbols and indices are as defined above;
IVc) $K^1=M$ and is selected from the group consisting of:
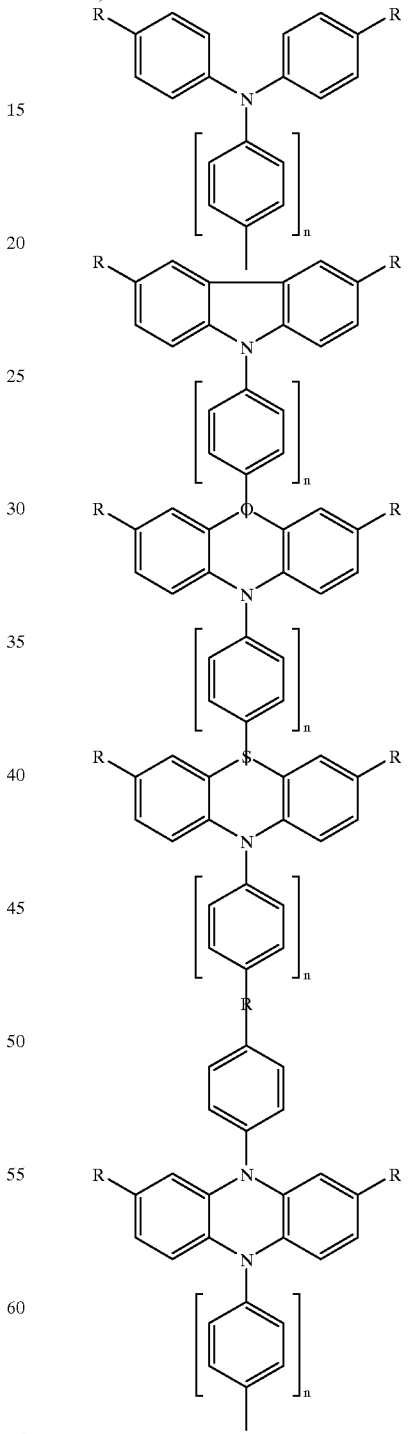

-continued
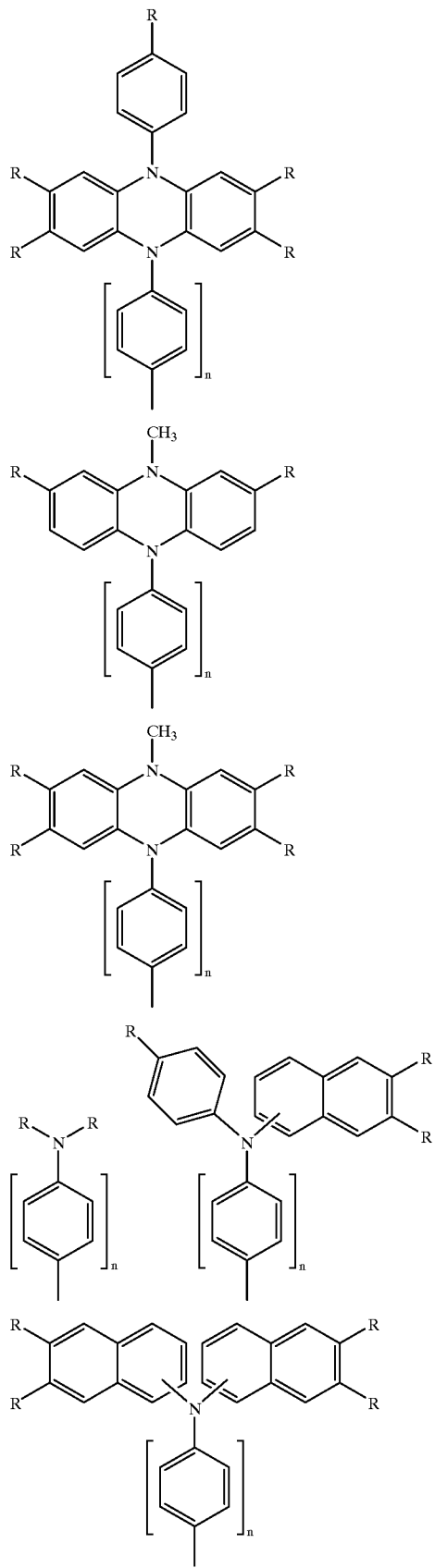
and M=N$^1$ and is selected from the group consisting of:
H, COOR, CH$_2$OR,
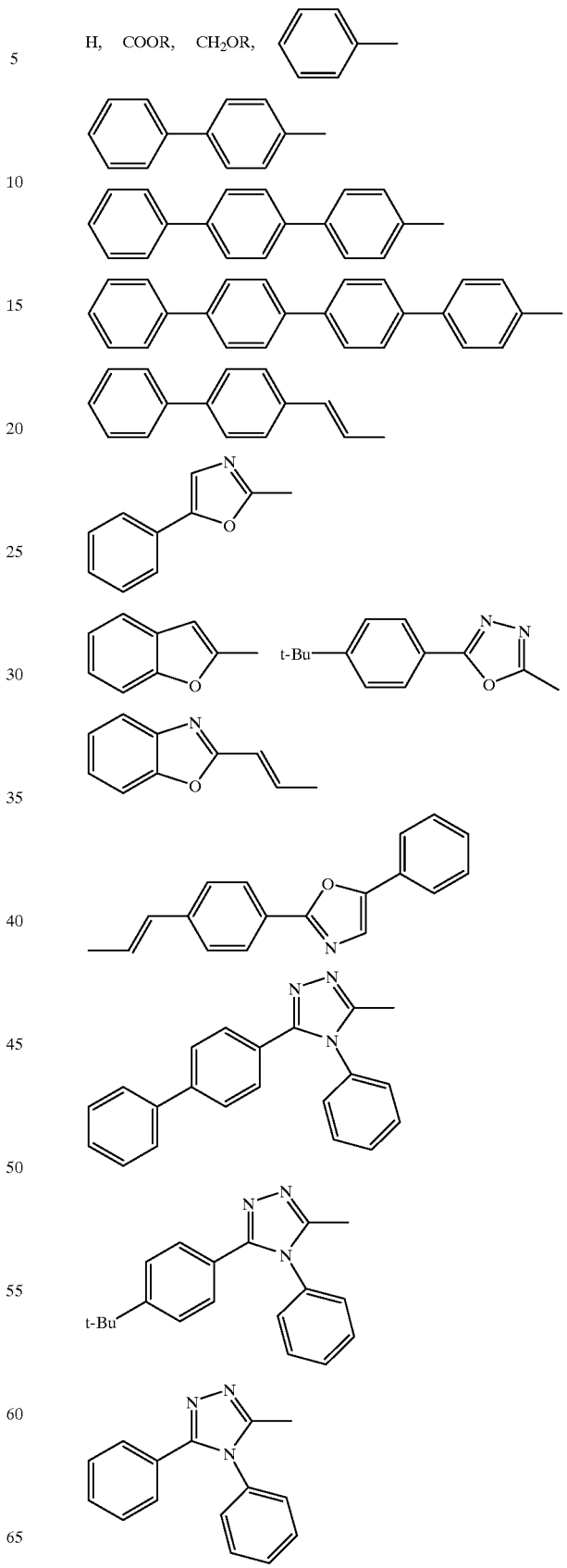

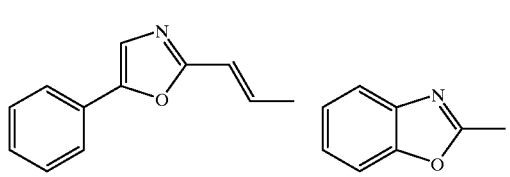
and Q, P¹ are identical or different and are selected from the group consisting of:
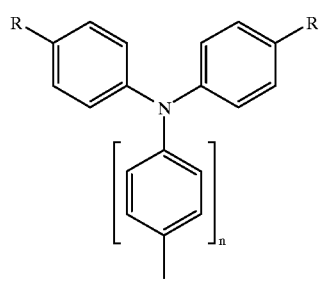
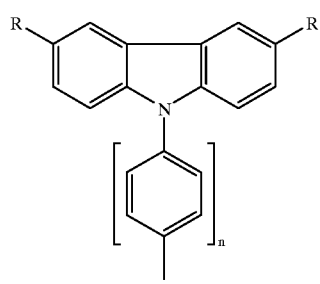
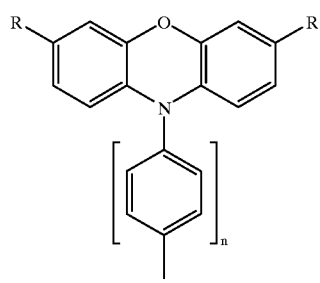
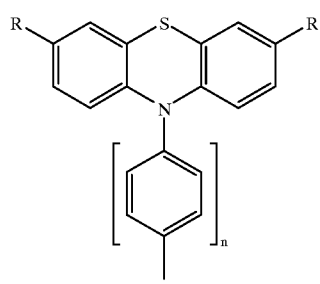
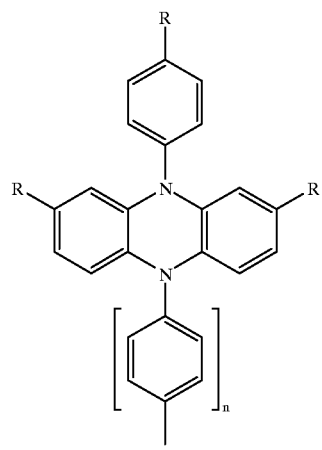
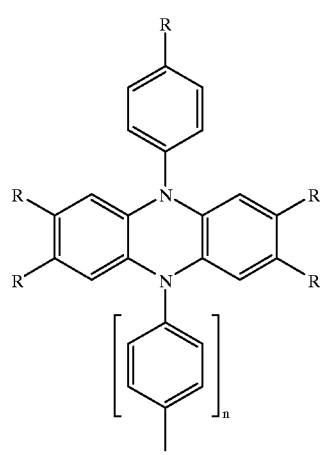
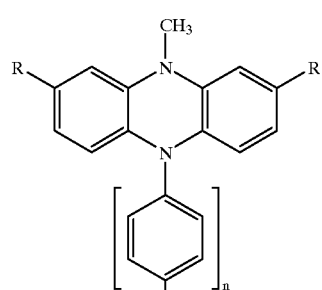
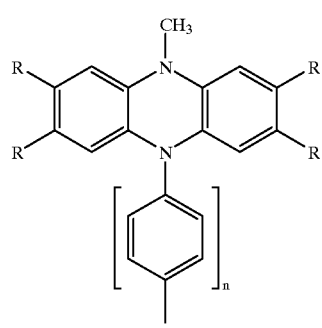

-continued
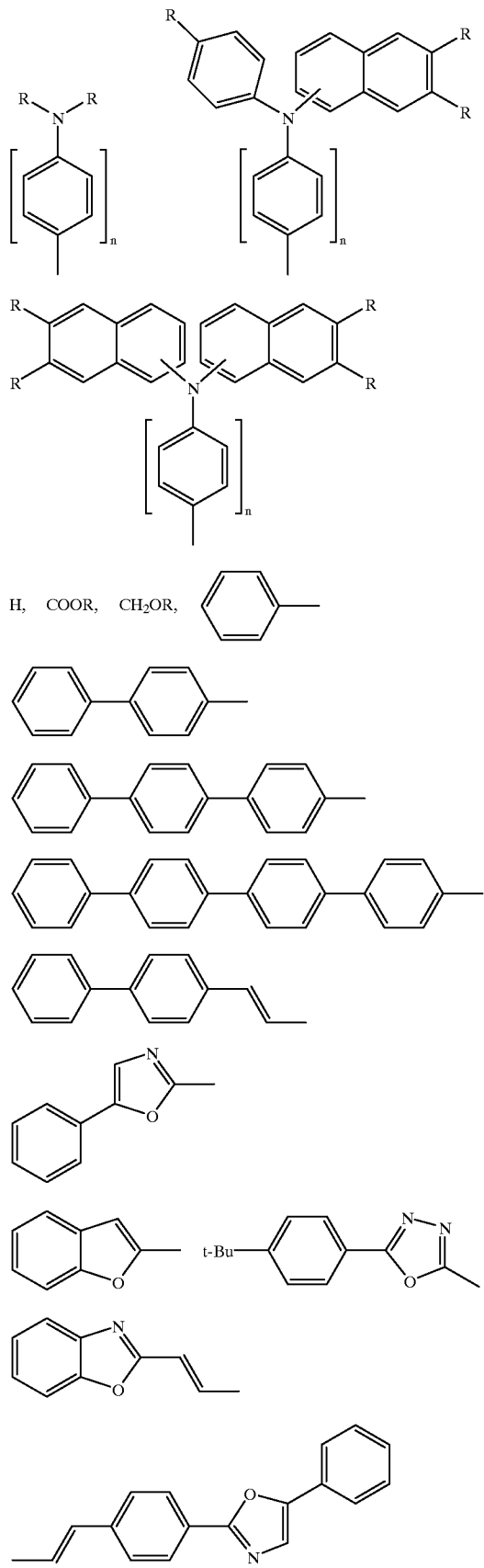
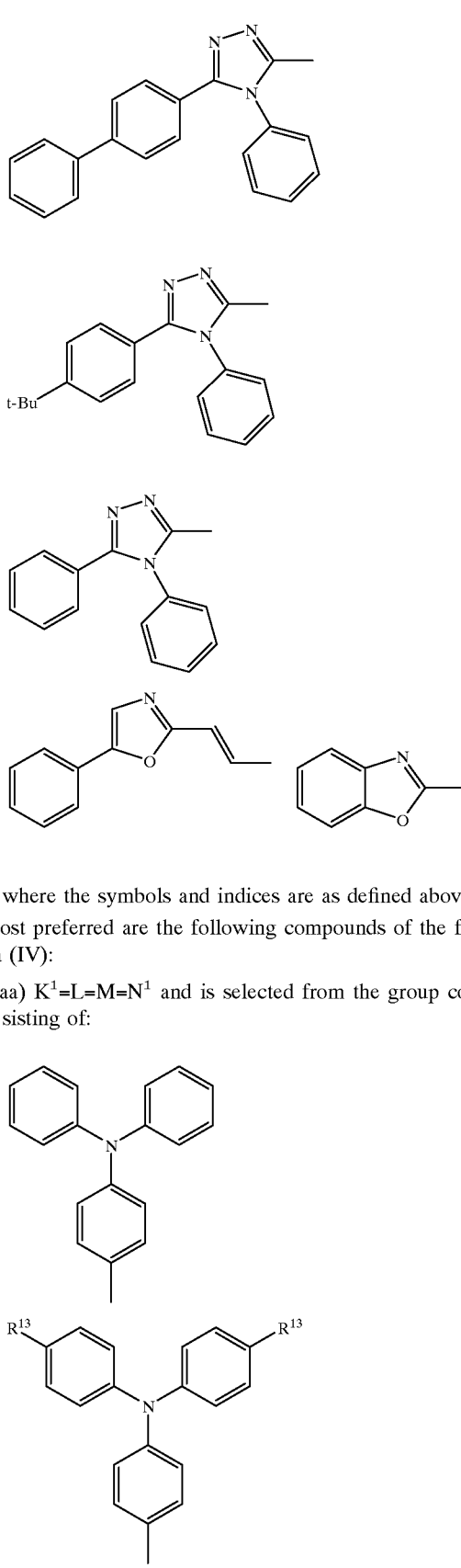
where the symbols and indices are as defined above.
Most preferred are the following compounds of the formula (IV):
Ivaa) $K^1=L=M=N^1$ and is selected from the group consisting of:

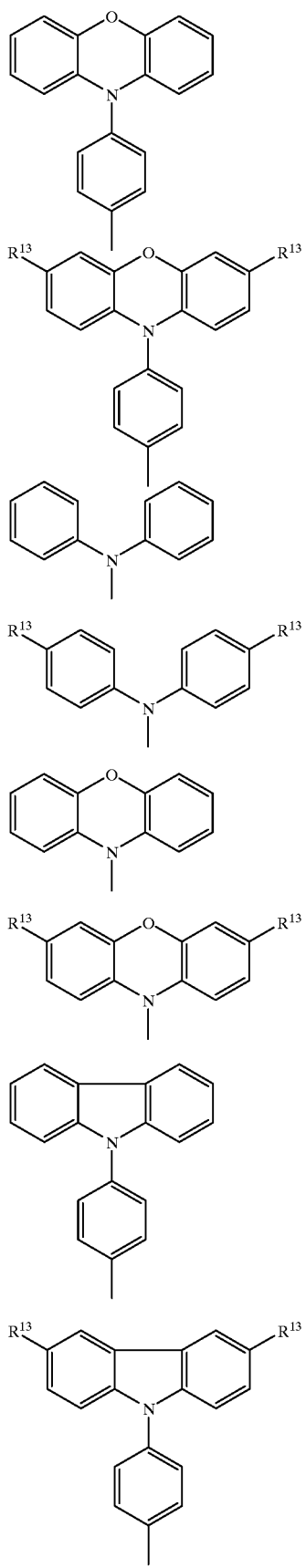
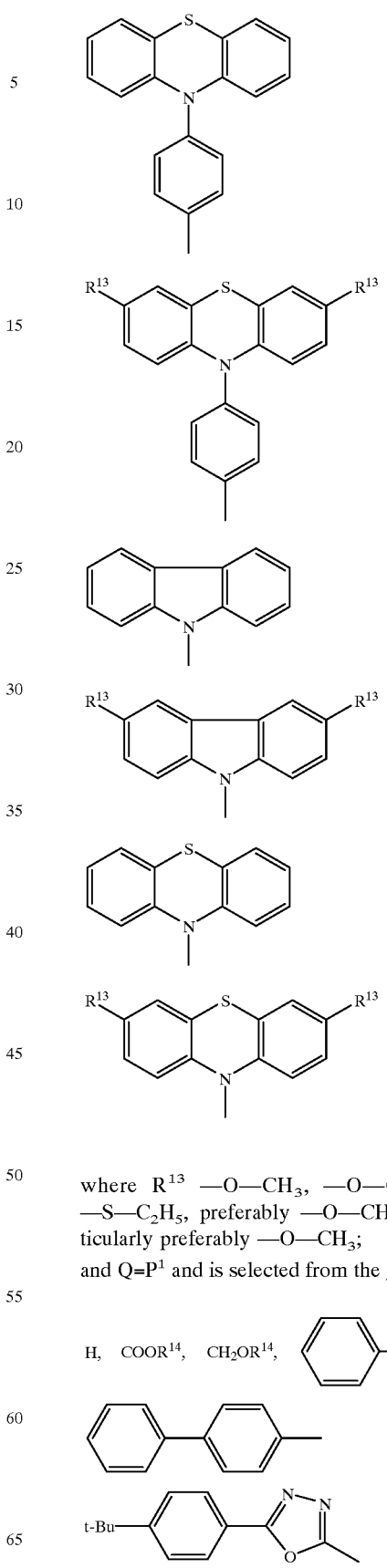
where $R^{13}$ —O—CH$_3$, —O—C$_2$H$_5$, —S—CH$_3$, —S—C$_2$H$_5$, preferably —O—CH$_3$, —S—CH$_3$, particularly preferably —O—CH$_3$;
and Q=P$^1$ and is selected from the group consisting of:

-continued
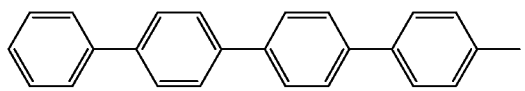
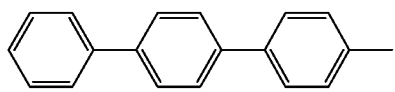
where $R^{14}$ is a straighten or branched alkyl group having from 1 to 12, preferably from 1 to 4, carbon atoms;
IV.ba) $K^1=L=M=N^1=Q=P^1$ and is selected from the group consisting of:
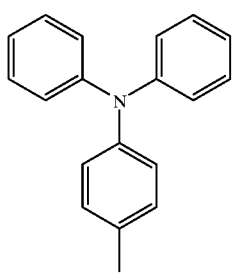
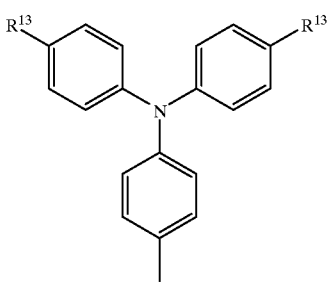
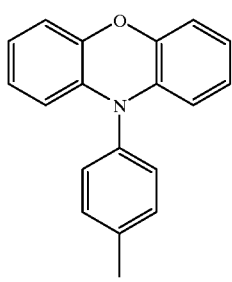
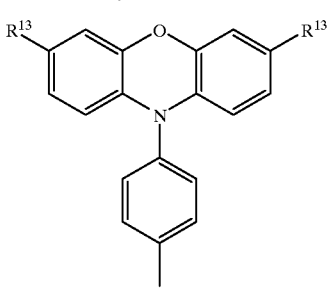
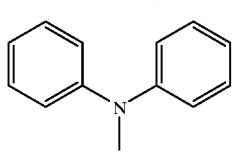
-continued
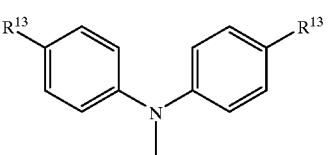
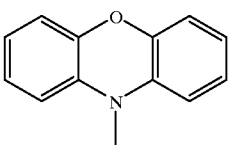
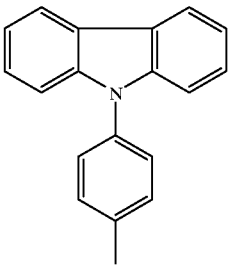
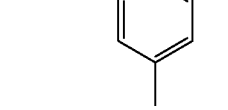
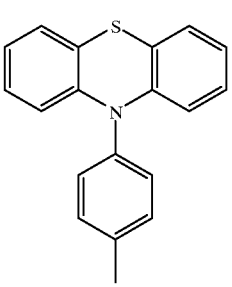
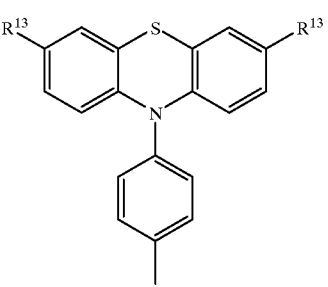

-continued
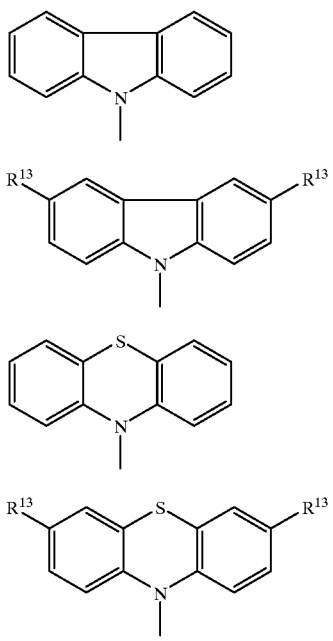
where R¹³ is as defined above;
IV.ca) K¹=L=M=N¹ and is selected from the group consisting of:
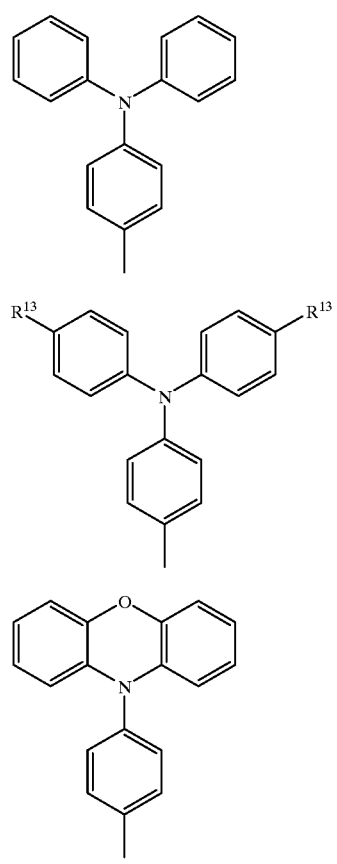
-continued
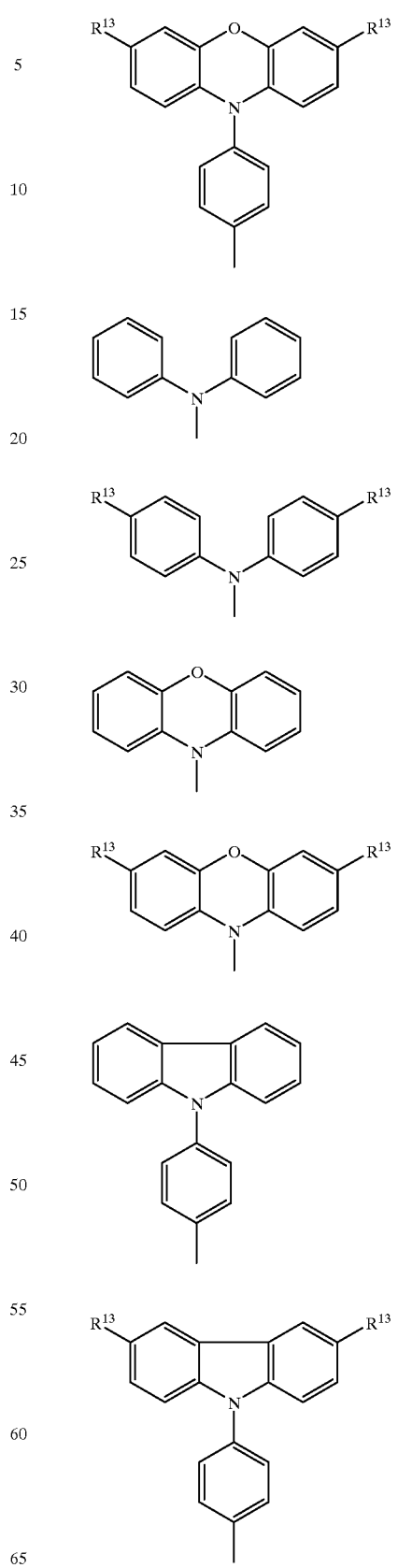

-continued

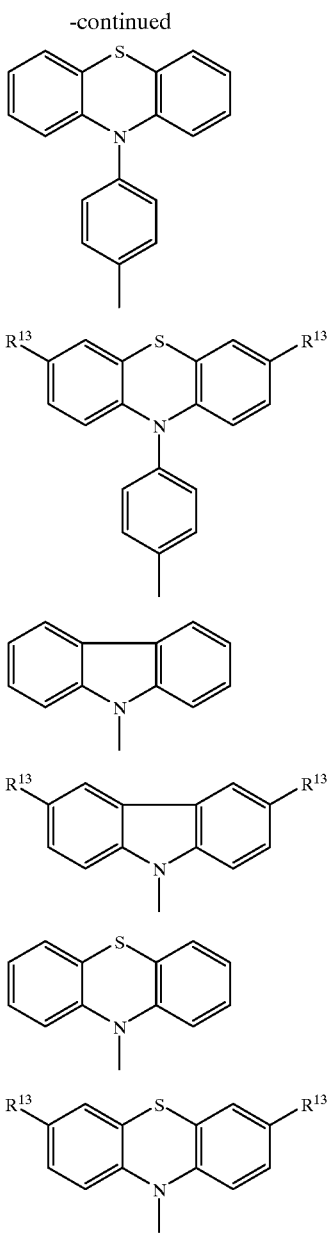

and Q=H and P¹ is selected from the group consisting of:

H, COOR¹⁴, CH₂OR¹⁴,

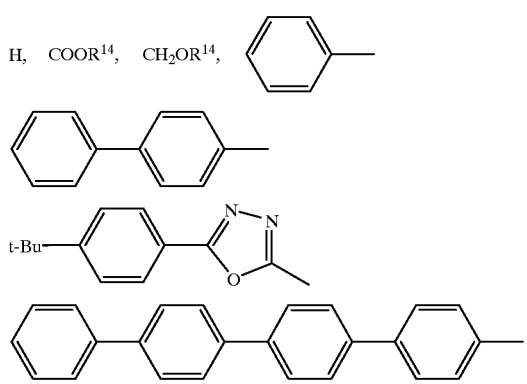

-continued

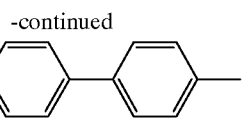

where $R^{13}$, $R^{14}$ are as defined above.

The spiro compounds used according to the invention are prepared by methods known per se from the literature, as are described in standard works on organic synthesis, e.g. Houben-Weyl, Methoden der Organischen Chemie, Georg-Thieme-Verlag, Stuttgart and in the appropriate volumes of the series "The Chemistry of Heterocyclic Compounds" by A. Weissberger and E. C. Taylor (editors).

The preparation is carried out under reaction conditions which are known and suitable for the reactions mentioned. Use can also be made of variants which are known per se and are not described in more detail here.

a) Carbospiro compounds

Compounds of the formula (IV) are obtained, for example, starting from 9,9'-spirobifluorene whose synthesis is described, for example, by R. G. Clarkson, M. Gomberg, J. Am. Chem. Soc. 1030, 52, 2881.

Compounds of the formula (IVa) can be prepared, for example, starting with a tetrahalogenation in the 2,2',7,7' positions of the 9,9'-spirobifluorene and subsequent substitution reaction (see, for example, U.S. Pat. No. 5,026,894) or via a tetraacetylation of the 2,2',7,7' positions of 9,9'-spirobifluorene with subsequent C—C coupling after conversion of the acetyl groups into aldehyde groups or heterocycle formation after conversion of the acetyl groups into carboxylic acid groups.

Compounds of the formula (IVb) can be prepared, for example, by methods analogous to those for the formula (Iva), with the stoichiometric ratios in the reaction being selected so that the 2,2' or 7,7' positions are functionalized (see, for example, J. H. Weisburger, E. K. Weisburger, F. E. Ray, J. Am. Chem. Soc. 1959, 72 4253; F. K. Sutcliffe, H. M. Shahidi, D. Paterson, J. Soc. Dyers Colour 1978, 94, 306 and G. Haas, V. Prelog, Helv. Chim. Acta 1969, 52 1202).

Compounds of the formula (IVc) can be prepared, for example, via a dibromination in the 2,2' positions and subsequent diacetylation and in the 7,7' positions of 9,9'-spirobifluorene with subsequent reaction by a method analogous to that for the compounds (IVa).

Compounds of the formula (IV) where $K^1$, L, Q, $P^1$=H and M=$N^1$ or Q, $P^1$=H, $K^1$=L and M=$N^1$ can be prepared, for example, by choice of appropriately substituted starting compounds in building up the spirobifluorene, e.g. 2,7-dibromospirobifluorene can be obtained from 2,7-dibromofluorenone and 2,7-dicarbethoxy-9,9'-spirobifluorene can be produced using 2,7-dicarbethoxyfluorenone. The free 2',7' positions of spirobifluorene can then be further substituted independently.

For the synthesis of the groups $K^1$, L, M, N, $N^1$, $P^1$, reference may be made, for example, to DE-A 23 44 732, 24 50 088, 24 29 093, 25 02 904, 26 36 684, 27 01 591 and 27 52 975 for compounds having 1,4-phenylene groups; DE-A 26 41 724 for compounds having pyrimidine-2,5-diyl groups; DE-A 40 26 223 and EP-A 0 391 203 for compounds having pyridine-2,5-diyl groups; DE-A 32 31 462 for compounds having pyridazine-3,6-diyl groups; N. Miyaura, T. Yanagi and A. Suzuki in Synthetic Communications 1981, 11, 513 to 519, DE-A-39 30 663; M. J. Sharp, W. Cheng, V. Snieckus, Tetrahedron Letters 1987, 28, 5093; G. W. Gray, J. Chem. Soc. Perkin Trans II 1989, 2041 and Mol. Cryst. Liq. Cryst. 1989, 172, 165; Mol. Cryst. Liq. Cryst. 1991, 204, 43 and 91; EP-A 0 449 015; WO 89/12039; WO 89/03821; EP-A 0 354 434 for the direct coupling of aromatics and heteroaromatics.

The preparation of disubstituted pyridines, disubstituted pyrazines, disubstituted pyrimidines and disubstituted pyridazines is described, for example, in the appropriate volumes of the series "The Chemistry of Heterocyclic Compounds" by A. Weissberger and E. C. Taylor (editors).

Amino compounds of the formula (I) can be built up using variants of the Ullmann reaction (J. March, Adv. Org. Chem., 4th edition, p. 665, John Wiley & Sons, New York 1992), as is described, for example, in Chem. Lett. 1989, 1145; Mol. Cryst. Liq. Cryst. 1994, 242, 127 and, in particular, in J. Salbeck et al., 213th ACS National Meeting, San Francisco 1997, Book of Abstracts p. 199. Another possibility is a process known from U.S. Pat. No. 5,576,460. Preference is given to preparing such compounds by a process disclosed in the German patent application 197 38 860.4 having the title "Verfahren zur Herstellung von Aryloligoaminen". This application is expressly incorporated by reference into the present description.

b) Heterospiro compounds

Such compounds of the formula (III) are obtained, for example, starting from bis[biphenyl-2,2'-diyl]silane (=9,9'-spirobi(9H—)silafluorene) (V), whose synthesis is described, for example, by H. Gilman, R. D. Gorsich, J. Am. Chem. Soc. 1958, 80, 3243.

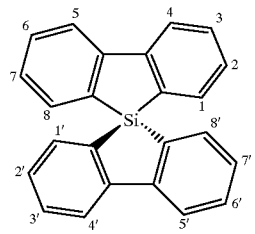

(V)

Heterospiro compounds of the formula (IIIa) can be prepared, for example, starting with a tetrahalogenation in the 2,2',7,7' positions of 9,9'-spirobi-9-silafluorene and a subsequent substitution reaction which is known from analogous C-spiro compounds (see, for example, U.S. Pat. No. 5,026,894) or via a tetraacetylation of the 2,2',7,7' positions of 9,9'-spirobi-9-silafluorene with a subsequent C—C coupling after conversion of the acetyl groups in aldehyde groups or heterocycle formation after conversion of the acetyl groups into carboxylic acid groups.

Compounds of the formula (IIIb) can be prepared, for example, by methods analogous to those used for the formula (IIIa), with the stoichiometric ratios in the reaction being selected so that the 2,2' or 7,7' positions are functionalized (see, for example, J. H. Weisburger, E. K Weisburger, F. E. Ray, J. Am. Chem. Soc. 1959, 72, 4253; F. K. Sutcliffe, H. M. Shahidi, D. Paterson, J. Soc. Dyers Colour 1978, 94, 306 and G. Haas, V. Prelog, Helv. Chim. Acta 1969, 52, 1202).

Compounds of the formula (IIIc) can be prepared, for example, via dibromination in the 2,2' positions with subsequent diacetylation in the 7,7' positions of 9,9'-spirobi-9-silafluorene and subsequent reaction using a method analogous to that for the compounds (IIIa).

Compounds of the formulae (IIIe)–(IIIg) can be prepared, for example, by choice of appropriately substituted starting compounds in building up the spirosilabifluorene according to the two reaction schemes below:

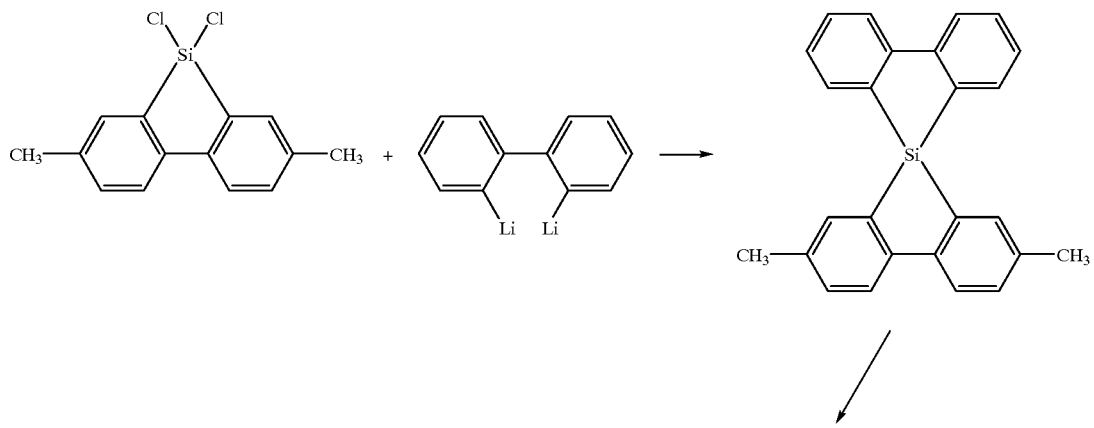

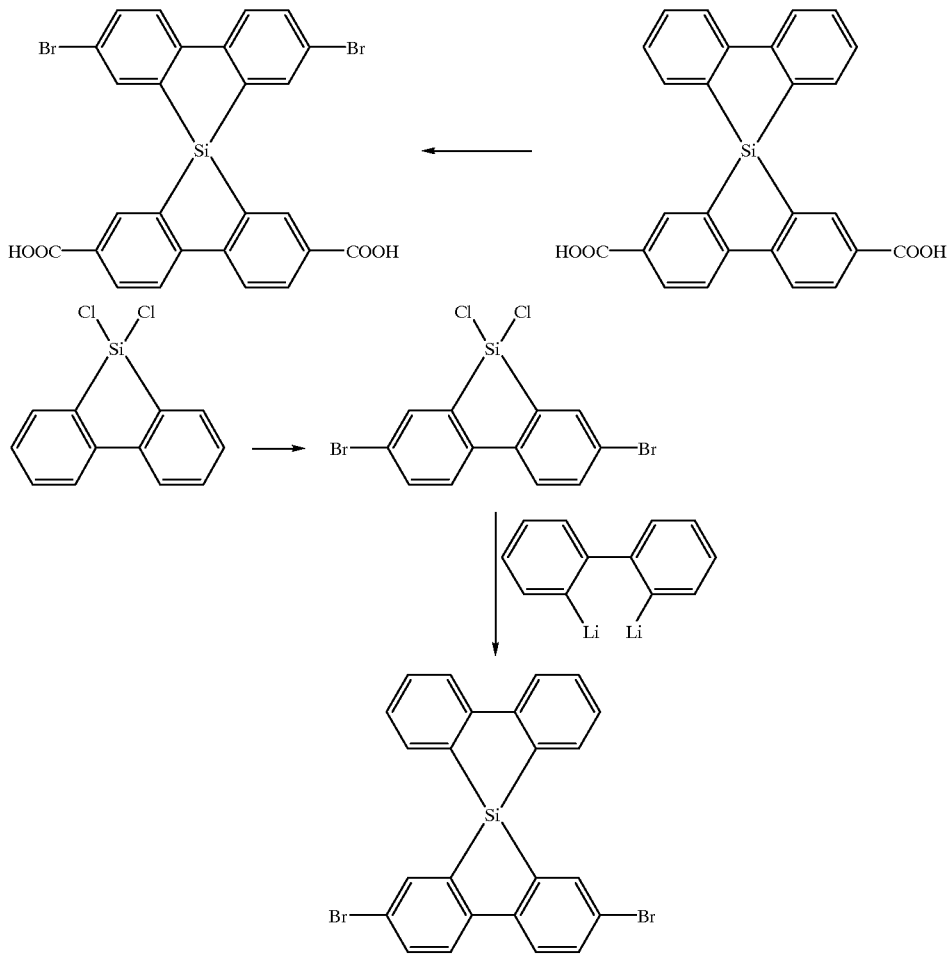

It is also possible to use other synthetic sequences with which those skilled in the art are familiar, for example nitration, reduction, diazotization and the Sandmeyer reaction. For the synthesis of the groups $K^1$, L, M, $N^1$, P, Q, reference is made to the corresponding carbospiro compounds.

It is also possible in principle to use oligomers or polymers comprising the corresponding spiro units, as long as the compounds are able to penetrate into the pores of the nanocrystalline semiconductors. Such compounds are described in EP-A 0 707 020; WO-A 96/17 036; DE-A 196 06 511; DE-A 196 14 971 and DE-A 196 15 128; these documents are hereby expressly incorporated by reference into the present application.

In a photovoltaic cell according to the invention, the hole conductor material dissolved in the electrolyte liquid serves, owing to its redox potential, purely as a relay substance for charge transport. Transfer of an electron from the ground state of a hole conductor compound according to the invention to the oxidized dye molecule regenerates the ground state of the semiconductor or sensitizer dye. At the counterelectrode, a further electron transfer from the electrode to the hole conductor molecule regenerates the ground state of this molecule.

In selecting the solvent for the electrolyte, a number of properties have to be taken into account. It is desirable for the solvents to have a low viscosity and a low vapor pressure; in practice, it is necessary to make a compromise between viscosity and vapor pressure. The solvent should also be stable toward redox reactions over a potential range of 3.0 V, namely at least from ±1.5 V to −1.5 V, measured relative to an aqueous, saturated calomel electrode. Preference is given to solvents whose anodic limiting potentials are even more positive. Particular preference is given to solvents whose anodic limiting potential is 2.5 V or more. Examples of suitable solvents, to which the invention is in no way restricted, are acetonitrile, glutarodinitrile, ethylene carbonate, propylene carbonate, chlorobenzene and 3-methyl-2-oxazilidinone and also mixtures of these with one another or with other solvents.

The concentration of a hole conductor compound according to the invention in the electrolyte is usually 0.1–3.0 M (M=mol/l), preferably 0.2–1.0 M. In addition to the neutral, reduced form of the compound, it is preferred that the oxidized free-radical cation is also present in the electrolyte solution, for example as a result of an addition at the beginning. In this case, the concentration of the oxidized form is preferably 0.001–0.2 M, particularly preferably 0.02–0.1 M.

Furthermore, preference is given to mixing a conductive salt into the electrolyte to increase the conductivity. Examples of suitable conductive salts, to which the invention is not restricted, are

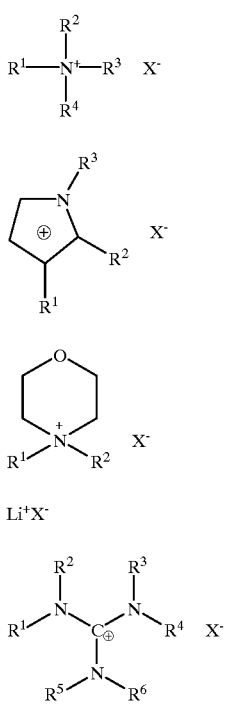

where the symbols have the following meanings:

R$^{1-6}$ are identical or different and are each a straight-chain or branched alkyl group having from 1 to 12 carbon atoms which may also be partially fluorinated or perfluorinated and X is an anion, preferably ClO$_4^-$, triflate or bistriflyimide.

The photovoltaic cell of the invention preferably comprises, as light-absorbing layer, a semiconductor which preferably has a very large band gap, particularly preferably at least 3.0 eV, particularly preferably above 3.0 eV.

Suitable semiconductors are thus preferably metal oxide semiconductors, in particular the oxides of transition metals and of the elements of main group III and transition groups IV, V and VI (of the Periodic Table of the Elements), of titanium, zirconium, hafnium, strontium, zinc, indium, yttrium, lanthanum, vanadium, niobium, tantalum, chromium, molybdenum, tungsten, but also oxides of zinc, iron, nickel or silver, perovskites such as SrTiO$_3$, CaTiO$_3$, or oxides of other metals of main groups II and III or mixed oxides or oxide mixtures of these metals. However, it is also possible to use any other metal oxide having semiconducting properties and a large energy difference (band gap) between valence band and conduction band. Titanium dioxide is particularly preferred as semiconductor material.

The semiconductor preferably has a roughness factor of greater than 1, particularly preferably greater than 20, very particularly preferably greater than 150.

The roughness factor is defined as the ratio of an actual/effective surface area to the area of projection of this surface of a body, in this case the surface of the semiconductor.

The roughness factor can be determined, for example, by gravimetric adsorption methods, as is described, for example, in F. Kohlrausch, Praktische Physik, Volume 1, p. 397 (Stuttgart: B. G. Teubner, 1985). In general, the size of the pores is 5–200 nm, preferably 10–50 nm.

A process for producing polycrystalline metal oxides semiconductor layers using the sol-gel method (described in detail in, for example, Staider and Augustynski, J. Electrochem. Soc. 1979, 126, 2007), where during the process step comprising the hydrolysis of the metal alkoxide the percentage relative humidity of the surrounding atomsphere can be in a range from 30%. to 80% and is kept constant to within ±5%, preferably ±1%, gives metal oxides semiconductor layers by means of which a particularly high electric yield can be achieved in photovoltaic cells of the invention.

The rough surface having a polycrystalline structure provides an area increased by the roughness factor for a, preferably monomolecular, surface layer of the chromophore. As a result, light incident on an area having a particular size is converted into electric energy with a significantly higher yield. The semiconductor can be regarded as transparent to the incident light. However, light is partially reflected on the surface and some of it reaches adjacent surfaces. The light which penetrates into the semiconductor and is not absorbed or converted impinges, partly directly and partly indirectly and also partly indirectly after total reflection of the surface, on chromophore molecules on the exit side, thus achieving a significantly higher light yield.

As an example of the production of a titanium oxide layer (TiO$_2$) having a high roughness factor on a titanium substrate, the sol-gel process is described below. The titanium substrate made of pure titanium having a purity of about 99.5% is first cleaned for about 30 minutes in boiling HCl having a concentration of about 18%. The titanium ethoxide solution can be obtained, for example, by dissolving 21 mmol of TiCl$_4$ in 10 ml of very pure ethanol (puriss.). This solution is then diluted with very pure methanol (puriss.) in order to obtain a titanium concentration in the range from about 25 to 50 mg/ml. A drop of the solution is placed on the titanium substrate and the titanium alkoxide is hydrolyzed at room temperature over a period of about minutes at a humidity of 48±1%. The substrate together with the hydrolyzed layer is then heated at about 450° C. for about 15 minutes. This process is repeated a number of times. After repeating it from 10 to 15 times, the TiO$_2$ layer has reached a thickness of about 20 μm. The substrate with the layer is subsequently heated at about 500° C. for about 30 minutes in a pure argon atmosphere (e.g. 99.997%). The TiO$_2$ layer produced in this way has a roughness factor in the region of 200. Such metal oxides semiconductor layers (also of other metals) can be produced on other substrates by analogous methods. The upper layers of the semiconductor can, if desired, be doped with a divalent or trivalent metal, for example as described in WO-A 91/16719.

The sensitivity, i.e. the photoelectronic yield for visible light, thus also for sunlight, can be increased by chromophores, also known as sensitizers or dyes, being chemically bound (chemisorbed) as charge carriers on or in the surface of the semiconductor. The two functions of light absorption and charge carrier separation are separated in these photoelectronic systems. The light absorption is performed by the chromophore in the surface region and the separation of the charge carriers occurs at the semiconductor/chromophore interface.

Various chromophores have different spectral sensitivities. The choice of chromophore can thus be matched to the spectral composition of the light of the light source in order to increase the yield as much as possible. Suitable chromophores, i.e. sensitizers, are, in particular, the complexes of transition metals of the type metal(L$_3$), metal(L$_2$) of ruthenium and osmium (e.g. ruthenium-tris(2,2'-bipyridyl-4,4'-dicarboxylic acid)) and their salts, ruthenium cis diaqua bipyridyl complexes such as ruthenium cis-diaqua-bis(2,2'-bipyridyl-4,4-dicarboxylates) and also porphyrins (e.g. zinc tetra(4-carboxyphenyl)porphyrin) and cyanides (e.g. iron hexacyanide complexes) and phthalocyanines.

The chromophores can be chemisorbed, adsorbed or otherwise fixed in the region of the surface of the metal oxide semiconductor. Good results have been achieved, for example, using chromophores which are bound to the surface of the metal oxide semiconductor via carboxylic acid or phosphonic acid ligands.

Suitable chromophores are described, for example, in Chem. Rev. 1995, 49–68.

Particular preference is given to ruthenium-tris(2,2'-bipyridyl-4,4'-dicarboxylic acid), its salts and the chromophores (VIII) and (IX),

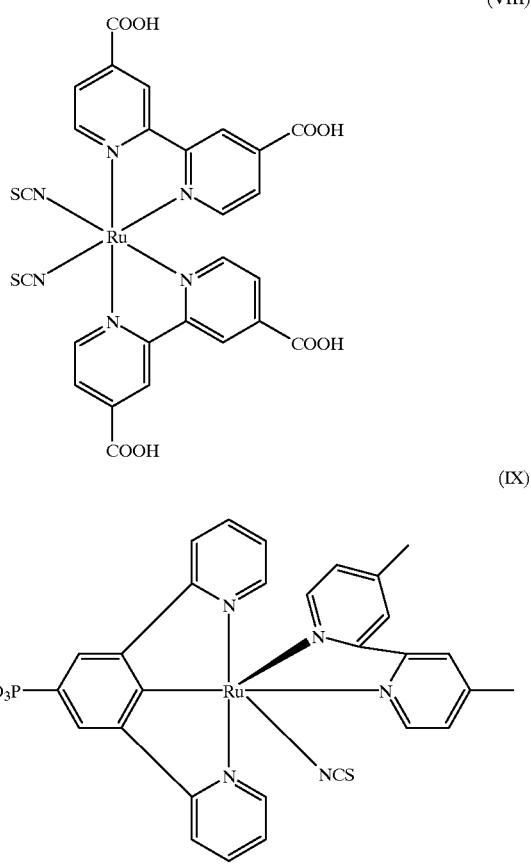

whose synthesis and properties are described in J. Chem. Soc. Chem. Comm. 1995, 65.

The application of the chromophore, for example ruthenium tris(2,2'-bipyridyl-4,4'-dicarboxylic acid) or a salt thereof, is camed out, for example, by dipping the substrate with the oxide layer into a solution, preferably an aqueous or alcoholic, preferably ethanolic solution, for about one hour. The concentration of the solution is preferably from 0.1 to 10 molar, particularly preferably from 1 to 5 molar, for example 2 molar. Other chromophores can be applied to titanium oxide or other metal oxide semiconductors by analogous methods.

Suitable materials for the electrode 15 are stable, metallically conductive substances, e.g. Au, Ag, Pt, Cu, or other metals. However, for some applications it is also possible to use preferably translucent conductive substances such as doped metal oxides, e.g. indium-tin oxide, Sb-doped tin oxide or Al-doped zinc oxide.

The electrode can, as described in EP-A 0 333 641, be applied to a transparent substrate, e.g. glass, and be joined to the electrolyte layer.

If desired, the electrode can also, as described in WO-A 93/19479, be coated with a further semiconductor.

Suitable electrically insulating materials 16 and 17 and materials for any lateral frame for the cell of the invention are, for example, plastic or glass.

The invention also provides a process for producing a photovoltaic cell, which comprises a) applying a semiconductor colloid to a solid conductive support, b) if desired, applying a dye (chromophore) on top of this, c) applying an electrolyte comprising a hole conductor compound as redox system on top of this, d) applying the counterelectrode including insulating layer on top of the above.

If desired, the cell can be sealed, for example using an adhesive or a film.

The photovoltaic cell of the invention generally has a thickness of from 5 to 20 mm (including substrate).

To avoid reflection losses, it can be provided with an antireflection coating having one, two or more layers.

To increase the light yield, the reverse side of the cell can be constructed in such a way that light is reflected diffusely back into the cell.

A further increase in the light yield can be achieved, for example, by the incident sunlight being concentrated, for example by mirrors or Fresnel lenses.

The cell of the invention can also be part of a tandem cell; in such devices a plurality of subcells convert light from different spectral regions into electric energy.

The cell of the invention is used as a photocell, i.e. its serves to generate electric energy from light. It is preferably a solar cell, i.e. a device for generating electric energy from sunlight.

The contents of the German patent application 197 11 713.9 having the title "Photovoltaische Zelle", on which the priority of the present application is based, and also the contents of the abstract of the present invention are hereby expressly incorporated by reference into the present application.

The invention is illustrated by the examples without being restricted thereby.

SYNTHESIS EXAMPLES

Example 1

9,9'-Spirobifluorene (1)

7.66 g of magnesium turnings and 50 mg of anthracene were placed under argon in 100 ml of dry diethyl ether in a 1 l three neck flask fitted with reflux condenser and were reacted with 75 g of 2-bromobiphenyl dissolved in 60 ml of dry diethyl ether. Subsequently, 56.77 g of 9 -fluorenone dissolved in 500 ml of dry diethyl ether were added dropwise while stirring. After addition was complete, the mixture was boiled for another 2 hours. The yellow magnesium complex which had precipitated was filtered off with suction and washed with ether. The yellow magnesium complex which had been filtered off was then hydrolyzed in a solution of 48 g of ammonium chloride in 800 ml of ice water. After stirring for 60 minutes, the fluorenol formed was filtered off with suction, washed with water and sucked dry. The dried produced was then taken up in about 800 ml of glacial acetic acid with addition of 3 ml of concentrated HCl and, after heating, was refluxed for 2 hours. After cooling, the product was filtered off with suction, washed with water and dried. To purify it further, it was recrystallized once from acetone. This gave 86 g of 9,9'-spirobifluorene as colorless crystals (82% yield).

Example 2

Synthesis of 2,2',4,4',7,7'-hexabromo-9,9'-spirobifluorene (2)

200 mg of anhydrous $FeCl_3$ were added to a solution of 3.16 g (10 mmol) of 9,9'-spirobifluorene in 20 ml of methylene chloride and the mixture was treated with ultrasound. The reaction flask was protected from light using aluminum foil. Subsequently, 9.85 g (3:15 ml, 62 mmol) of bromine in 5 ml of methylene chloride were added dropwise at the boiling point over a period of 15 minutes. The solution was refluxed and treated with ultrasound for a further 20 hours. After cooling, petroleum ether was added and the mixture was filtered with suction. The product was further purified by recrystallization from THF/methanol and dried at 80° C. for 5 hours. Yield: 6.15 g(77%) of colorless crystals.

Example 3

2,2',7,7'-Tetraiodo-9,9'-spirobifluorene (3)

In a 100 ml two-neck flask fitted with reflux condenser and drying tube, 3.16 g (10 mmol) of 9,9'-spirobifluorene dissolved in 30 ml of chloroform were admixed at room temperature with 5.8 g (22.8 mmol) of iodine and subsequently 10.75 g (25 mmol) of bis(trifluoroacetoxy) iodobenzene were added. The reaction mixture warmed up to about 40° with formation of a light colored precipitate. After 1.5 hours, the product which had precipitated was filtered off with suction, washed with chloroform and dried. The chloroform solutions were combined and washed in succession with saturated sodium sulfite solution, saturated sodium carbonate solution and water. After drying over sodium sulfate, the solution was evaporated to give a second product fraction. Both product fractions were combined, boiled in acetone and, after cooling, filtered off with suction. This gave 2,2',7,7'-tetraiodo-9,9'-spirobifluorene as a finely crystalline colorless powder in virtually quantitative yield (8.1 g).

$^1$H-NMR ($CDCl_3$, ppm): 6.98 (d, J=1.48 Hz, 4 H, H-1, 1',8,8'); 7.54 (dd, J=7.88, 1.48 Hz, 4 H, H-3,3',6,6'); 7.72 (d, J=7.88 Hz, 4 H, H-4,4',5,5').

Example 4

2,2',7,7'-Tetrakis(diphenylamino)-9,9'-spirobifluorene (4)

In a 100 ml three-neck flask fitted with reflux condenser and nitrogen valve, 25 ml of o-xylene were added to a mixture [lacuna] (5.01 g, 6.11 mmol), diphenylamine. (5.36 g, 31.7 mmol), activated copper (1.52 g, 23.9 mmol), potassium carbonate (6.60 g, 47.8 mmol and 18-crown-6 (499 mg, 1.89 mmol) and the reaction mixture was refluxed for 82 hours, with the mixture becoming brown. The reaction mixture which had become solid was refluxed in 15 ml of toluene until it was liquid again. It was then filtered and the solid inorganic residue was washed with 15 ml of toluene. Filtrate and residue were worked up separately.

The dried inorganic residue was boiled in 20 ml of water, with the inorganic salts dissolving. After cooling to room temperature, the residue was filtered off with suction and, after drying, dissolved in 20 ml of toluene. The solution was refluxed for 15 minutes, allowed to cool, filtered with suction and the residue (copper) was washed with 15 ml of toluene. The filtrate was evaporated and the dried organic residue was boiled in 15 ml of acetone for 5 minutes. After cooling on an ice bath, the solid was filtered off with suction and washed with a little cold acetone. The crude product was dried under reduced pressure at 50° C. The crude yield of the first fraction was 1.48 g.

The filtrate was evaporated to dryness and the solid residue was boiled in 15 ml of acetone for 30 minutes. After cooling on an ice bath, the solid was filtered off with suction and washed with acetone. The crude product was dried under reduced pressure at 50° C. The crude yield of the second fraction was 2.07 g. The total crude yield was 3.55 g (3.60 mmol, 59%).

To purify the product further, the two fractions were combined and dissolved in hot chloroform. The solution was filtered with suction through a G4 frit twice in order to remove finely divided copper. The filtrate was evaporated and the dried residue was boiled in 20 ml of diethyl ether with addition of 3–4 drops of hydrazine hydrate for minutes. After cooling on an ice bath, the solid was filtered off with suction and washed. Subsequently, the solid was recrystallized by taking it up in chloroform and precipitating it at the boiling point with diethyl ether. After cooling on an ice bath, the partly crystalline, light-yellow solid which had precipitated was filtered off with suction and washed with diethyl ether. The pure product was dried under reduced pressure at 80° C.

Yield: 2.81 g (2.85 mmol, 47%) of slightly yellowish powder or needles.

Example 5

2,2',7,7'-Tetrakis(N,N-di-p-methoxyphenylamino)-9,9'-spirobifluorene (5)

In a 100 ml three-neck flask fitted with reflux condenser and nitrogen valve, 25 ml of o-xylene were added to a mixture of the substance from Example 3 (5.01 g, 6.11 mmol), 4,4'-dimethoxydiphenylamine (7.26 g, 31.7 mmol), activated copper (1.52 g, 23.9 mmol), potassium carbonate (6.60 g, 47.8 mmol) and 18-crown-6 (499 mg, 1.89 mmol) and the reaction mixture was refluxed for 70 hours, with the mixture assuming a reddish color.

The inorganic residue was filtered off with suction and washed with o-xylene until the washings were colorless. The filtrate was then evaporated to dryness. Subsequently, the two fractions were worked up separately.

The reaction solution was evaporated to dryness, the solid residue was taken up in 10 ml of methanol and boiled. This gave a stick, viscous mass. The solid was filtered off with suction, dried quickly and boiled in 40 ml of methanol with addition of 2 drops of hydrazine hydrate for about 3 hours. The solid was filtered off with suction, washed and dissolved in acetone at the boiling point (undissolved substance was filtered off). This solution was then added while stirring to 250 ml of cold methanol. The yellow solid which had precipitated was filtered off with suction, washed and dried under reduced pressure at 50° C. The crude yield was 5.21 g (4.25 mmol, 70%).

A further 290 mg could be isolated by means of the following work-up. 20 ml of water were added to the dried inorganic residue and the mixture was boiled for about 10 minutes to dissolve the inorganic salts. After cooling to room temperature, the mixture was filtered with suction and the solid residue (copper and product) was stirred in 10 ml of acetone for 20 minutes. The mixture was filtered with suction and the mother liquor was evaporated. The dried solid was then taken up in 5 ml of methanol and boiled for about 20 minutes with addition of 2 drops of hydrazine hydrate. The solid was filtered off with suction, washed and dried under reduced pressure at 50° C. To purify the crude product further, it was boiled in a mixture of 50 ml of methanol and 5 ml of acetone for about 2 hours. After cooling on an ice bath, the solid was filtered off with suction, washed with methanol, dried and boiled in a mixture of 50 ml of isopropanol and 5 ml of acetone for 2 hours. After cooling on an ice bath, the solid was filtered off with suction, washed with isopropanol and the dried solid was boiled in 60 ml of hexane for 2 hours. In the following, the solution was always filtered hot with suction from the undissolved solid. The solid was then boiled in a mixture of 75 ml of hexane and 6 ml of acetone for 1.5 hours. After filtration with suction and washing with hexane, the solid was dried under reduced pressure. It was then boiled in 75 ml of heptane for 4 hours with addition of 3 drops of hydrazine hydrate. The solid was then filtered off with suction, washed and dried under reduced pressure at 50° C.

USE EXAMPLES

Example 6

To produce a photovoltaic cell according to the invention, a nanocrystalline dispersion of $TiO_2$ prepared by the sol-gel method was applied by screen printing to a conductive glass support coated with fluorine-doped tin dioxide and heated at about 450° C. for 30 minutes in a stream of air. The thickness of the $TiO^2$ layer was about 5 μm. As sensitizer, a monolayer of tris(2,2'-bipyridyl-4,4'-dicarboxylic acid)ruthenium(II) chloride was adsorbed from a $5\times10^{-3}$ M aqueous solution at pH 4. As electrolyte, use was made of a 250 g/l solution of N,N'-diphenyl-N,N'-bis(3-methylphenyl)-(1,1'-biphenyl)-4,4'-diamine (TPD) in a 4:1 by volume mixture of toluene and acetonitrile containing 100 g/l of tetrabutylammonium tetrafluoroborate as conductive salt. The counterelectrode consisted of a glass substrate coated with F-doped $SnO_2$ which had been coated with about 3 A of platinum. The cell prepared in this way was short/circuited and irradiated with monochromatic light produced by means of a high-pressure lamp with monochromator. The number of incident photons was determined by means of a photodetector which measures a diverted part of the beam and compared to the current generated at the irradiation wavelength. The integrated photon-to-current efficiency (IPCE) was determined as a function of the wavelength by dividing the number of electrons generated by the number of incident photons. An IPCE of up to 0.7% was measured at 440 nm.

Example 7

A cell was produced as described in Example 6. The sensitizer used was $RuL_3^{4-}$. The electrolyte consisted of a 50 g/l solution of the substance from Example 4 as redox system in chloroform and about 25 g/l of diethylimidiazolium trifluorosulfonate (lmTfl) as conductive salt. The IPCE of the cell was about 3% at 440 nm. On irradiation with the full spectrum of the sun at 1000 W/m², the short-circuit current was about 165 μA/cm².

Example 8

A cell was produced as described in Example 6. As sensitizer, use was made of bis(2,2'-bipyridyl-4,4'-dicarboxylic acid)bisthiocyanatoruthenium(II) chloride (VIII), which was absorbed from a $5\times10^4$ molar ethanolic solution. The electrolyte consisted of an about 25 g/l solution of the substance from Example 5 as redox system in chloroform and about 25 g/l of ethylmethylimidiazolium trifluorosulfonate (lmTfl) and about 10 g/l of $Li(CF_3SO_2)_2N$ as conductive salts. The IPCE of the cell (see FIG. 2) was about 35% at 440 nm. On irradiation with the full spectrum of the sun at 1000 W/m², the short-circuit current was about 5.6 mA/cm². The overall efficiency of energy conversion was about 2.5%.

Example 9

A cell was produced as described in Example 6. As sensitizer, use was made of bis(2,2'-bipyridyl-4,4'-dicarboxylic acid)bisthiocyanatorhenium(II) chloride (VIII) which was absorbed from a $5\times10^{-4}$ molar ethanolic solution. The electrolyte consisted of an about 15 g/l solution of the substance from Example 5 as redox system in glutaronitrile and about 25 g/l of ethylmethylimidiazolium trifluorosulfonate (lmTfl) as conductive salt. The IPCE of the cell is about 38% at 440 nm. On irradiation with the full spectrum of the sun at 1000 W/m², the short-circuit current was about 5.5 mA/cm². The overall efficiency of energy conversion was about 2.5%.

What is claimed is:

1. A photovoltaic cell (10) comprising an electrolyte (14) which comprises a dissolved spiro or heterospiro hole conductor compound of the formula (I),

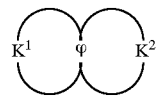

(I)

wherein

Ψ is C, Si, Ge or Sn, and $K^1$ and $K^2$ are, independently of one another, conjugate systems, as redox system, and wherein the electrolyte (14) is in a liquid state.

2. A cell as claimed in claim 1 wherein the spiro or heterospiro compound is a spirobifluorene derivative of the formula (II),

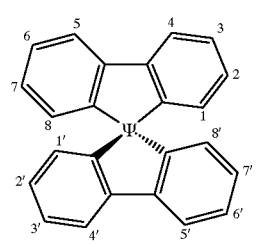

(II)

where Ψ is C, Si, Ge or Sn and the benzo groups may, independently of one another, be substituted and/or fused.

3. A cell as claimed in claim 2 wherein the 9,9'-spirobifluorene derivative is a compound of the formula (III),

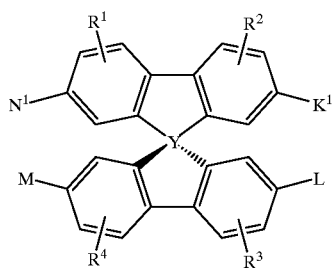

(III)

where the symbols and indices have the following meanings:

Ψ is C, Si, Ge or Sn, $K^1$, L, M, $N^1$, $R^1$, $R^2$, $R^3$, $R^4$ are identical or different and are each a) hydrogen, $NO_2$, —CN, —F or —Cl, b) a straight-chain or branched alkyl radical having from 1 to 20 carbon atoms, where b1) one or more nonadjacent $CH_2$ groups can be replaced by , —O—, —S—, —CO—O—, —O—CO—, —O—CO—O—, $NR^5$ or —Si$(CH_3)_2$— and/or b2) one or more $CH_2$ groups can be replaced by —CH=CH—, —C≡C—, 1,4-phenylene, 1,4-cyclohexylene or 1,3-cyclopentylene and/or b3) one or more H atoms can be replaced by F and/or Cl, and/or c) one of the following groups:

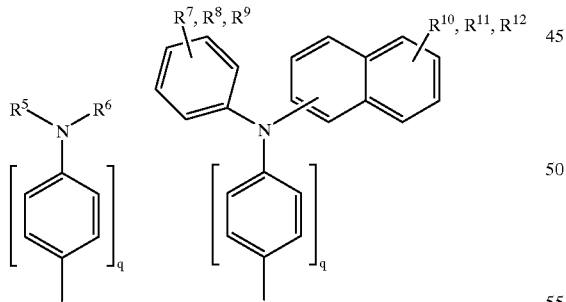

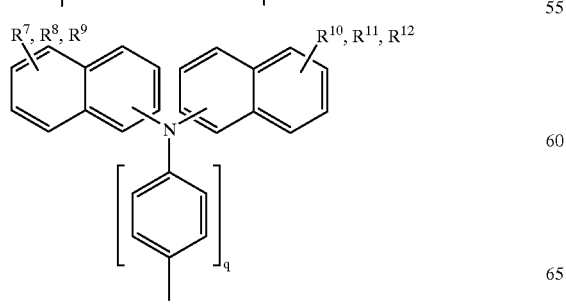

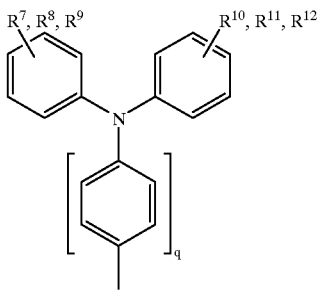

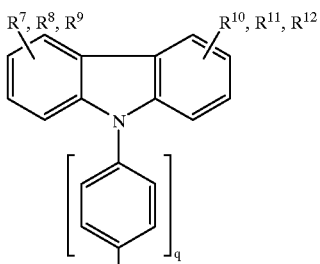

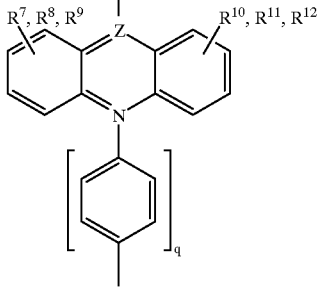

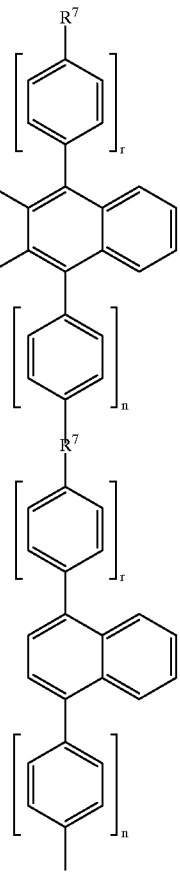

-continued

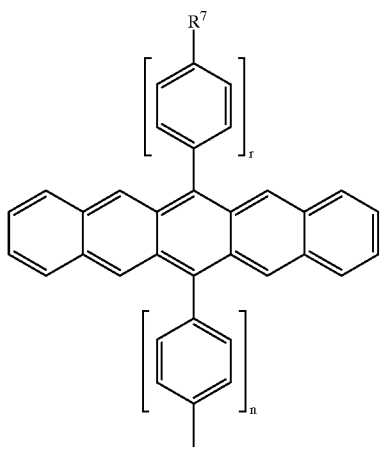

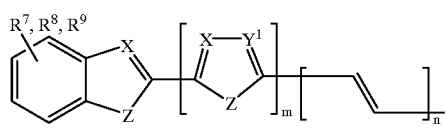

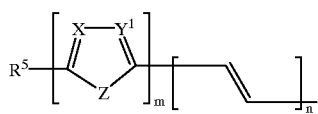

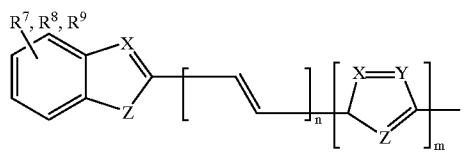

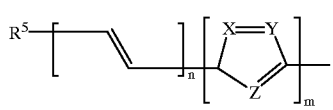

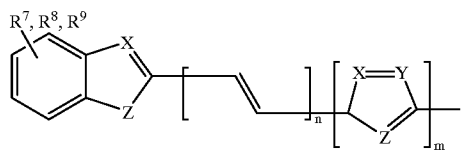

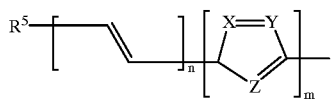

X, $Y^1$ are in each case identical or different and are =$CR^7$— or =N—;

Z is —O—, —S—, —$NR^5$—, —CRR—, —CR=CR— or —CR=N—;

$R^5$, $R^6$ are in each case identical or different and are each
a) hydrogen
b) a straight-chain or branched alkyl radical having from 1 to 20 carbon atoms, where
b1) one or more nonadjacent $CH_2$ groups which are not bound to nitrogen can be replaced by —O—, —S—, —CO—O—, —O—CO—, —O—CO—O— or —Si$(CH_3)_2$— and/or
b2) one or more $CH_2$ groups can be replaced by —CH=CH—, —C≡C—, cyclopropane1,2-diyl, 1,4-phenylene, 1,4-cyclohexylene or 1,3-cyclopentylene and/or
b3) one or more H atoms can be replaced by F and/or Cl and/or
b4) $R^5$ and $R^6$ can together also form a ring;
c) phenyl, biphenyl, 1-naphthyl, 2-naphthyl, 2-thienyl, 2-furanyl;

$R^7$, $R^8$, $R^9$, $R^{10}$, $R_{11}$, $R^{12}$ are identical or different and are each
a) hydrogen, —CN, —F, $NO_2$ or —Cl,
b) a straight-chain or branched alkyl radical having from 1 to 20 carbon atoms, where
b1) one or more nonadjacent $CH_2$ groups can be replaced by —O—, —S—, —CO—O—, —O—CO—, —O—CO—O—, —$NR^5$ or —Si$(CH_3)_2$— and/or
b2) one or more $CH_2$ groups can be replaced by —CH=CH—, —C≡C—, cyclopropane-1,2-diyl, 1,4-phenylene, 1,4-cyclohexylene or 1,3-cyclopentylene and/or
b3) one or more H atoms can be replaced by F and/or Cl;
c) phenyl, biphenyl, 1-naphthyl, 2-naphthyl, 2-thienyl, 2-furanyl, —O-phenyl, —O-biphenyl, —O-1-naphthyl, —O-2-naphthyl, —O-2-thienyl, —O-2-furanyl;

m, n, p, q, r are in each case identical or different and are 0, 1, 2, 3, 4, 5 or 6.

4. A cell as claimed in claim 3 wherein the 9,9'-spirobifluorene derivative is a compound of the formula (IV),

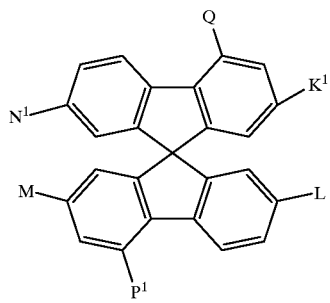

(IV)

where the symbols have the following meanings:

IV.a) $K^1$=L=M=$N^1$=

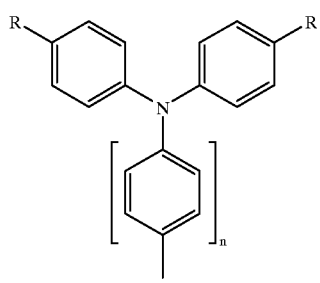

-continued

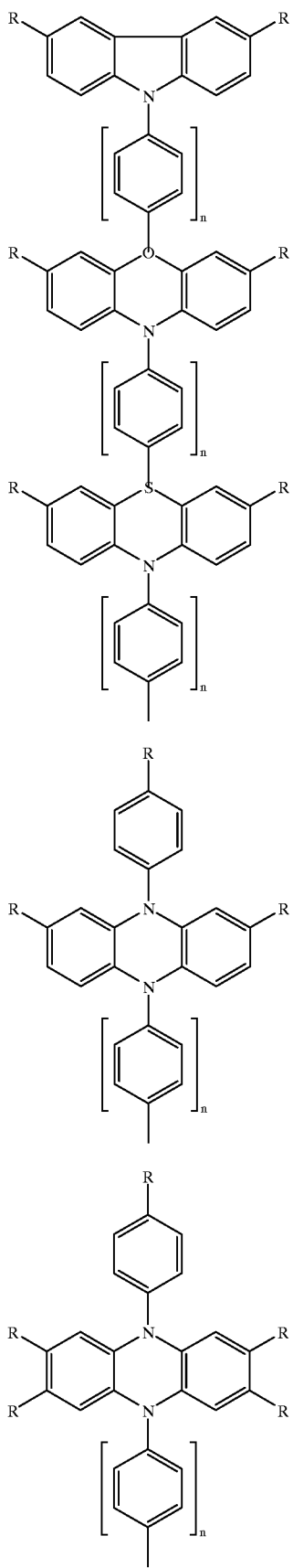

-continued

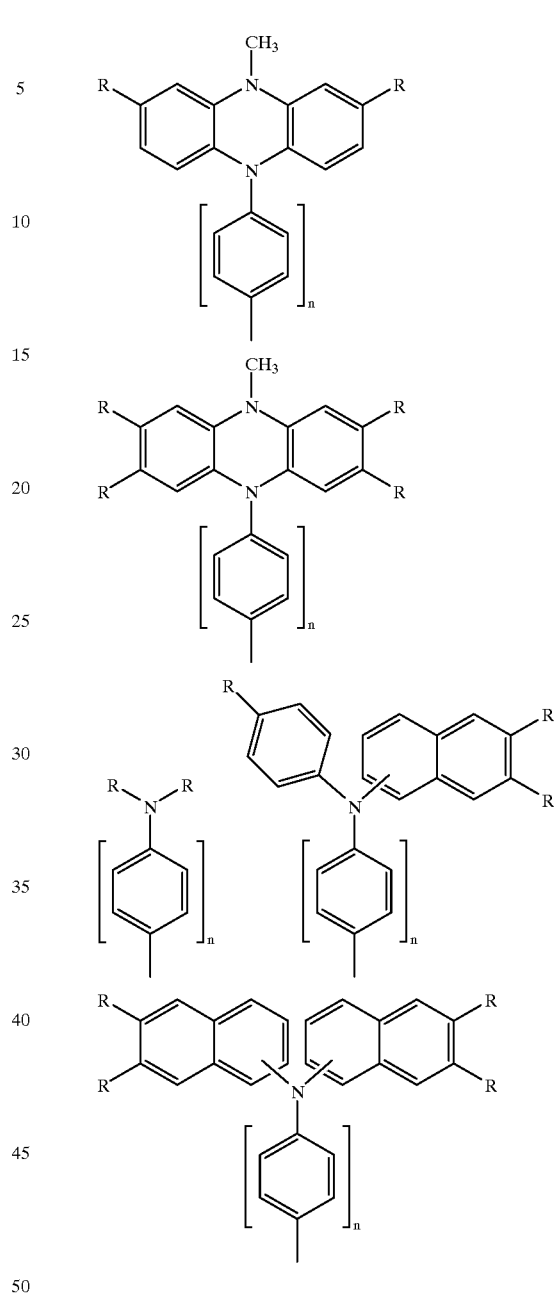

R are identical or different and are H, alkyl, —O-alkyl, —S-alkyl, each having from 1 to 20 carbon atoms, phenyl, biphenyl, 1-naphthyl, 2-naphthyl, 2-thienyl, 2-furanyl, —O-phenyl, —O-biphenyl, —O-1-naphthyl, —O-2-naphthyl, —O-2-thienyl, —O-2-furanyl, where O-alkyl/aryl, S-alkyl/aryl, CN and NR$_2$ must not be bound to nitrogen;

n=0,1,2,3,4;

and Q, P$^1$ are identical or different and are selected from the group consisting of:

H, COOR, CH$_2$OR, 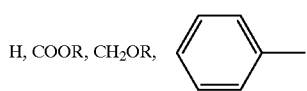

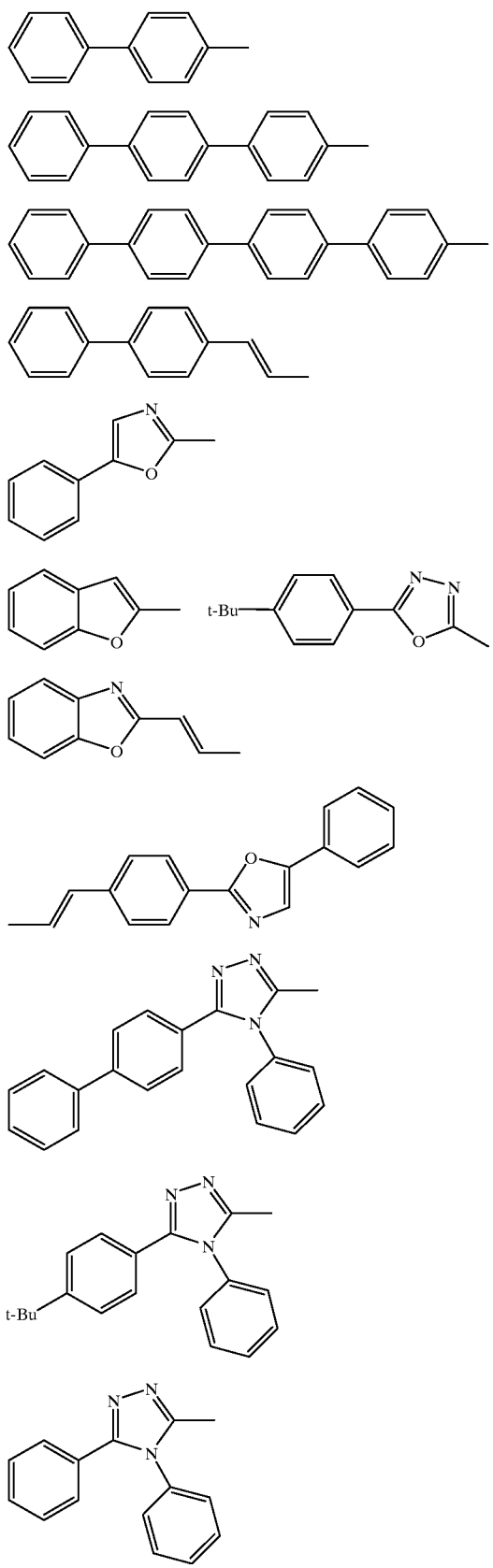
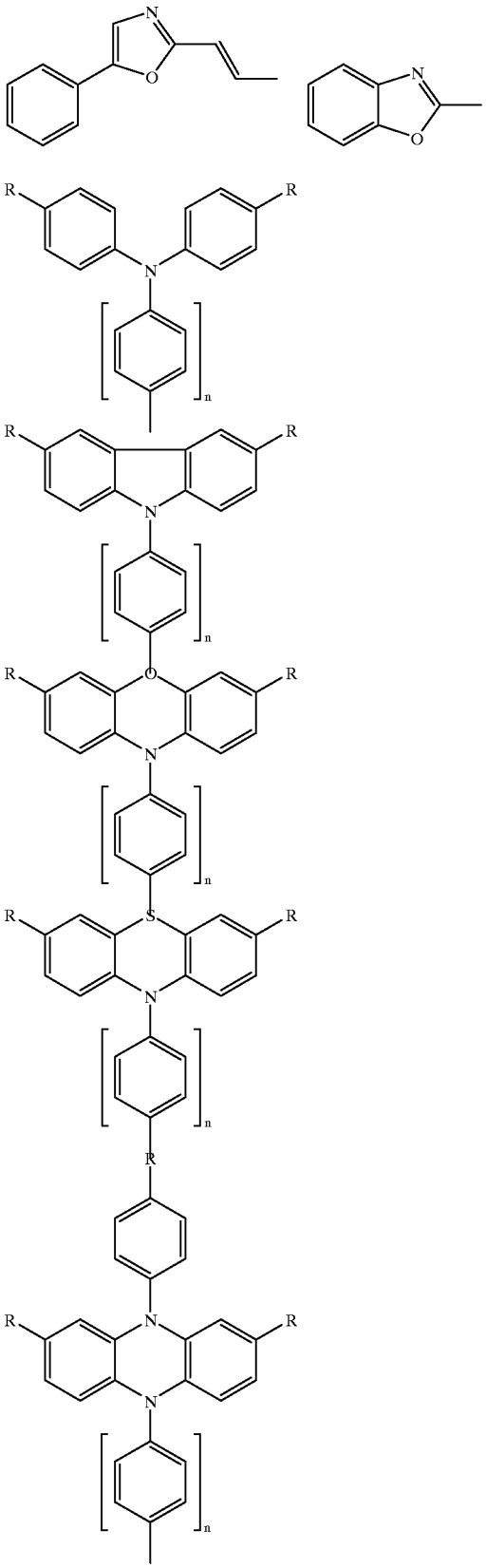

-continued
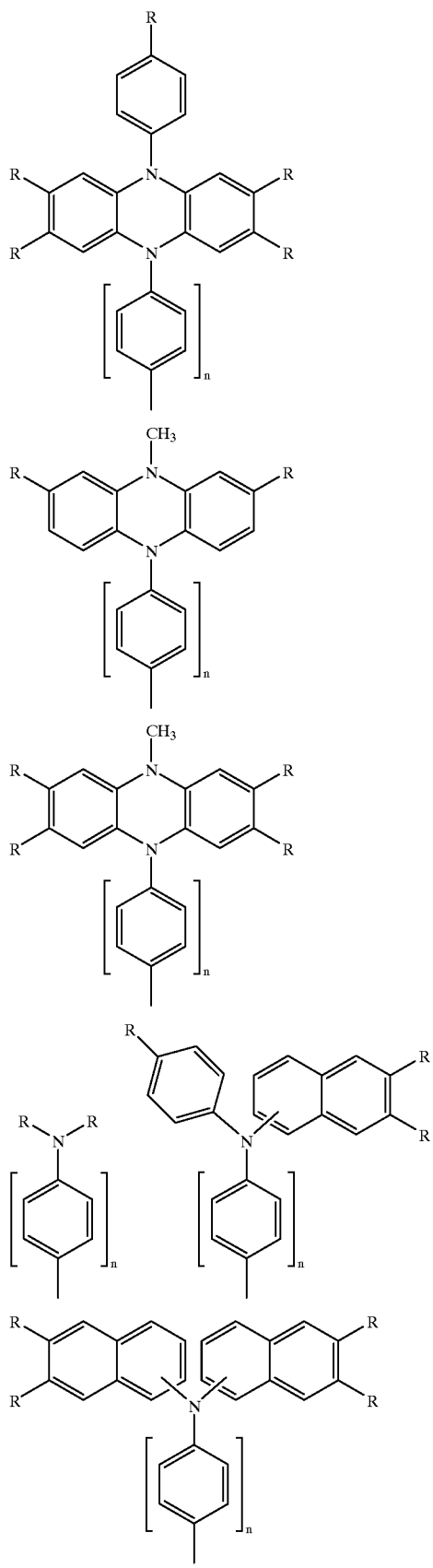
where the symbols and indices are as defined above;
IV.b) $K^1 = N^1$ and is selected from the group consisting of:
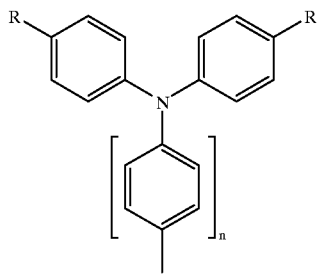
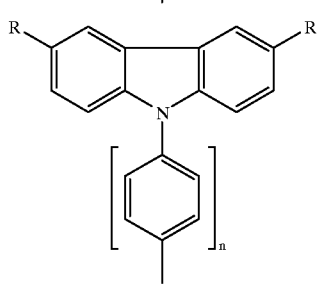
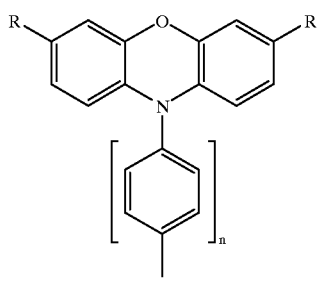
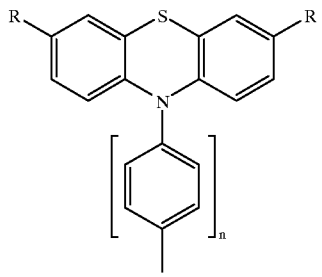
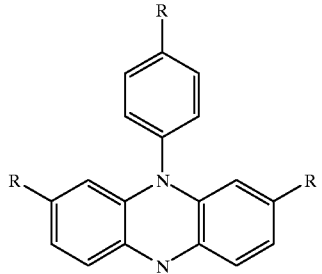
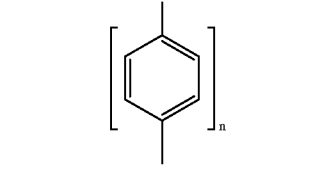

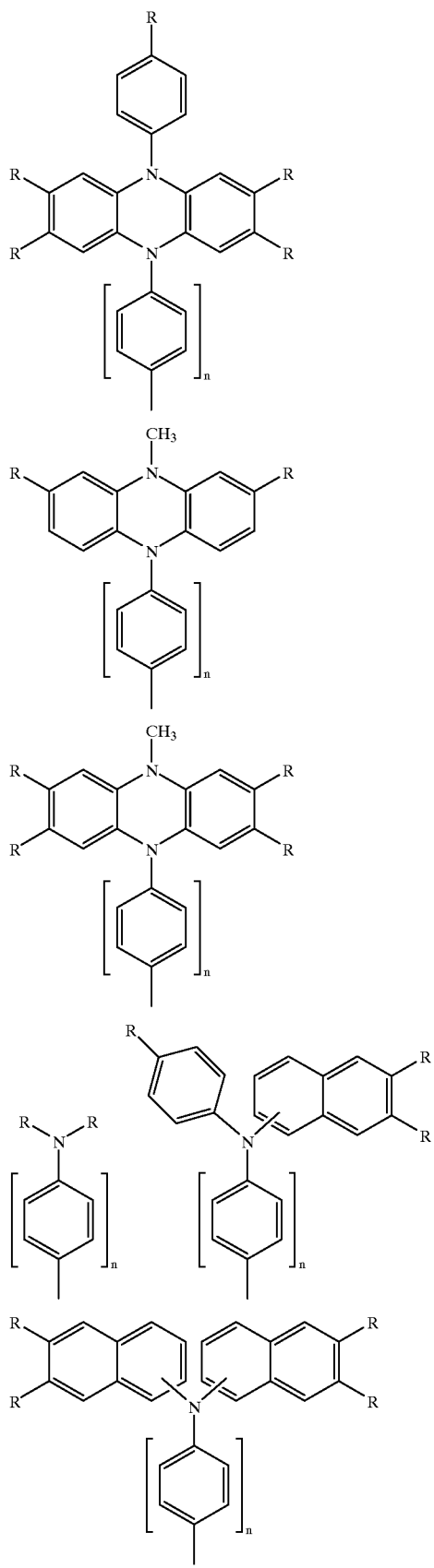
and L=M and is selected from the group consisting of:
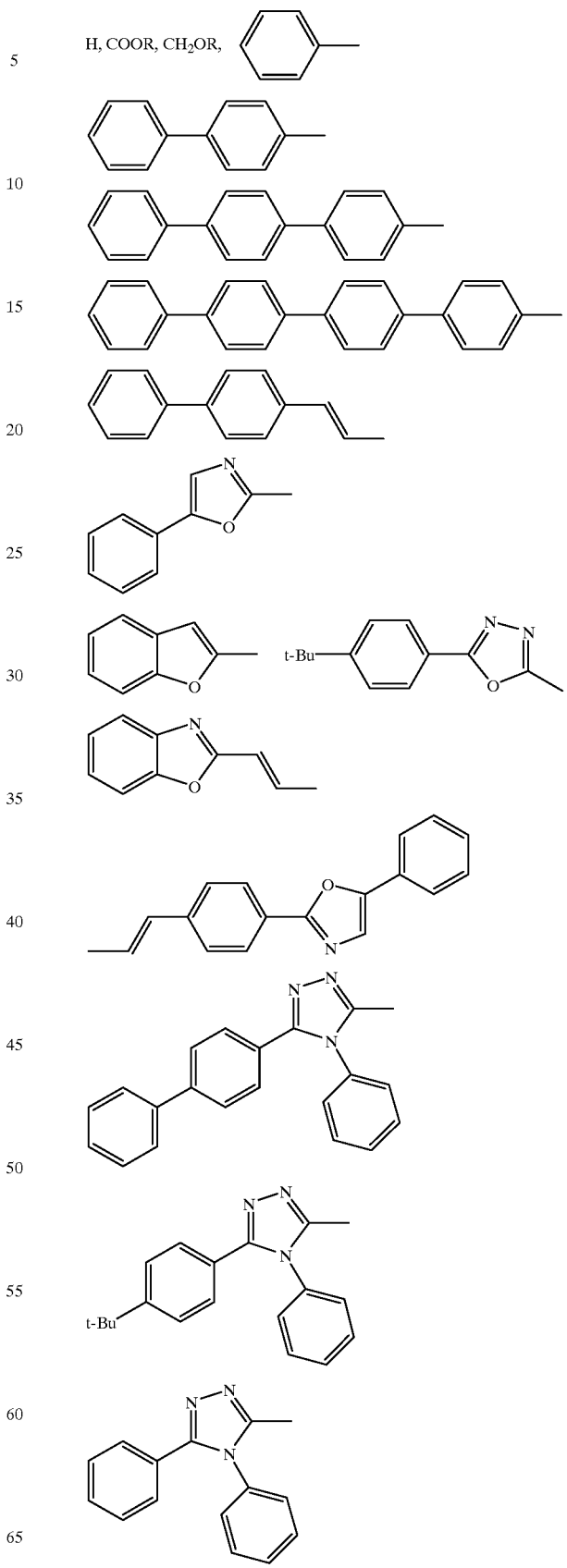

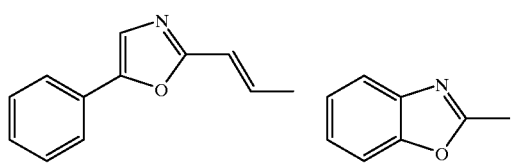
and Q, P$^1$ are identical or different and are selected from the group consisting of:
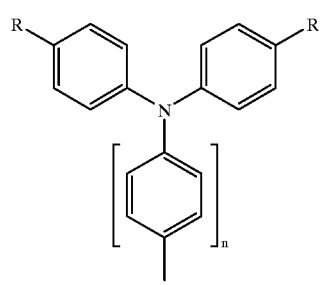
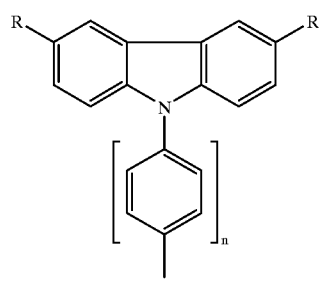
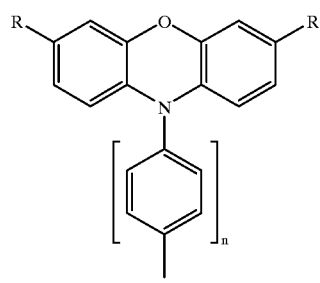
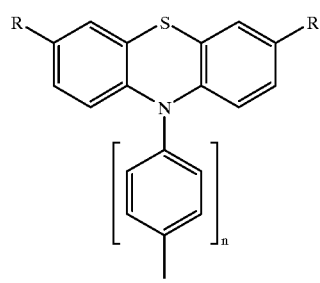
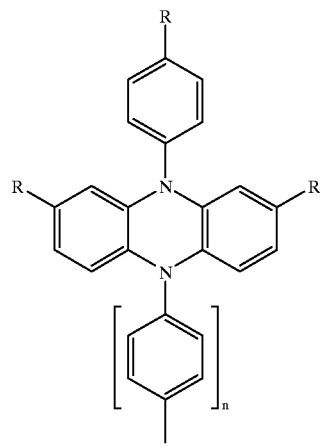
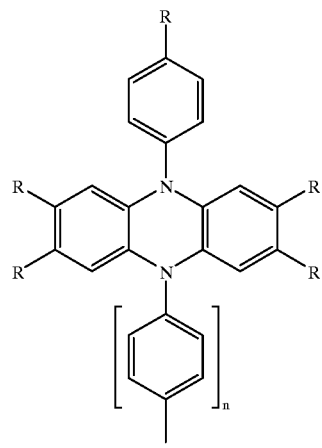
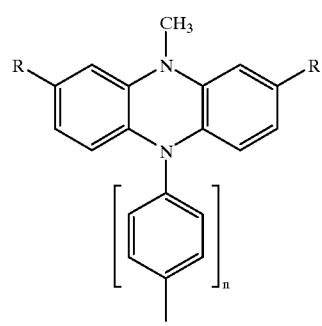
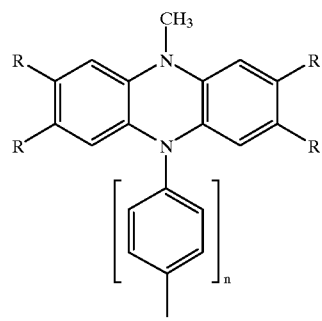

-continued
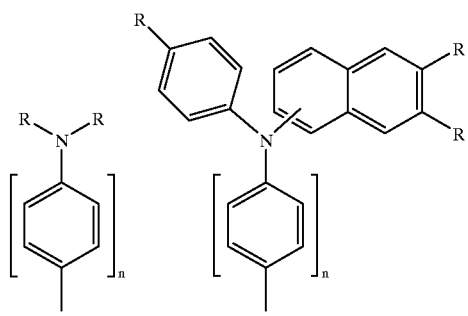
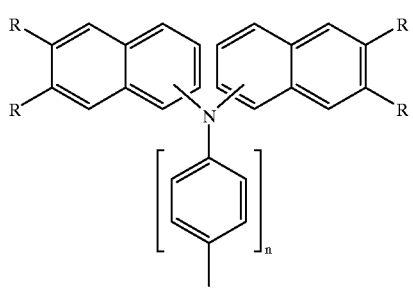
H, COOR, CH₂OR,
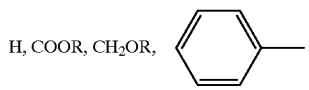
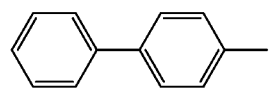
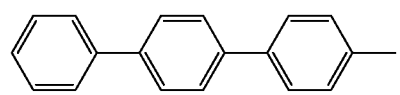
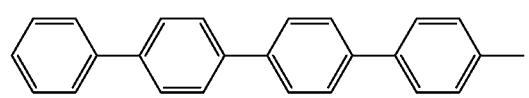
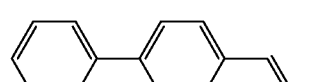
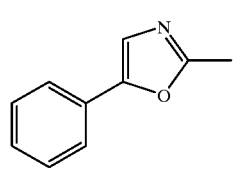
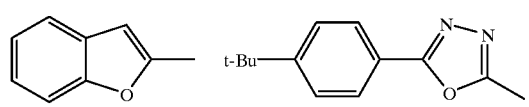
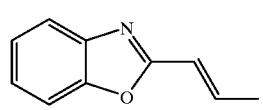
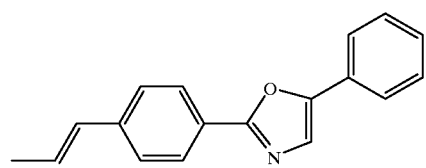
-continued
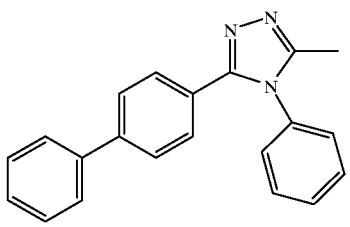
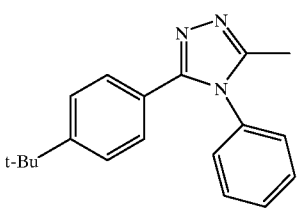
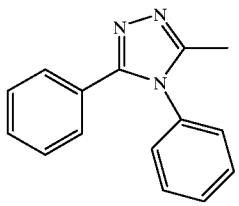
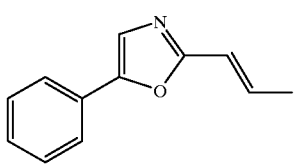 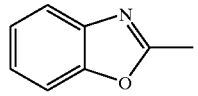
where the symbols and indices are as defined above;
IVc) $K^1 = M$ and is selected from the group consisting of:
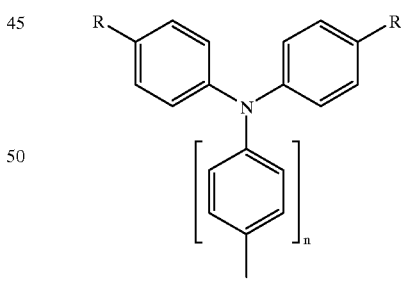
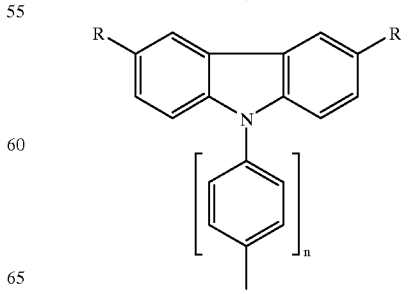

-continued
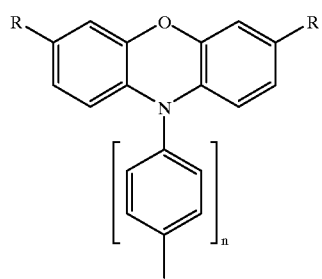
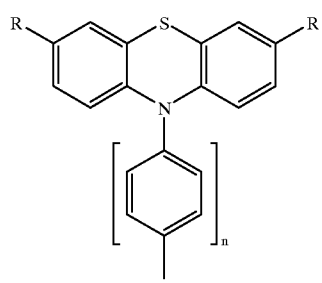
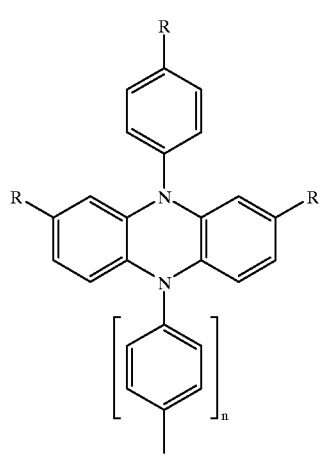
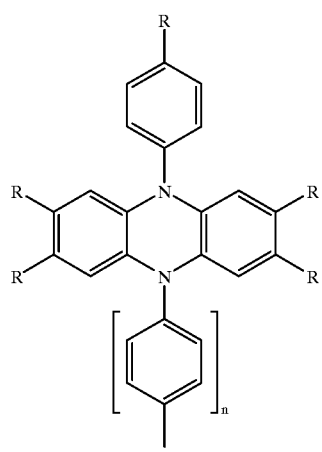
-continued
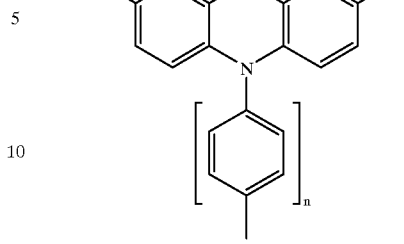
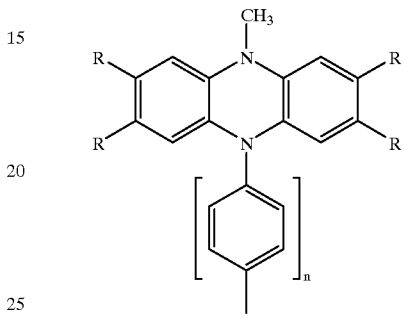
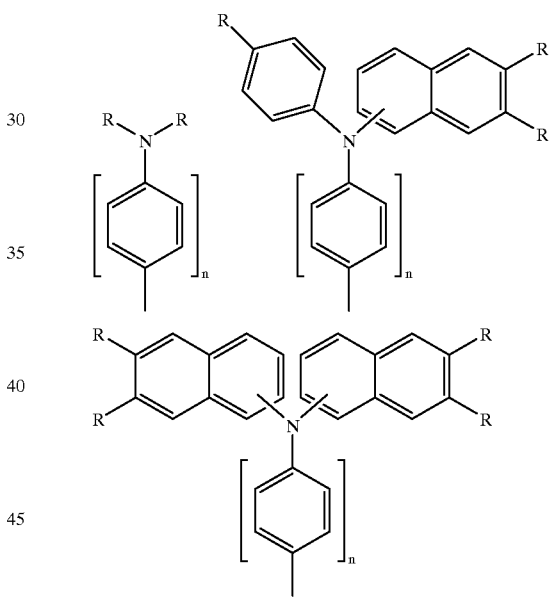
and M=N¹ and is selected from the group consisting of:
H, COOR, CH₂OR, 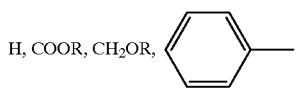
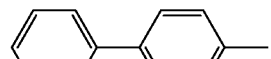
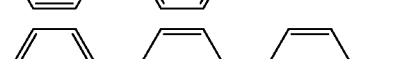
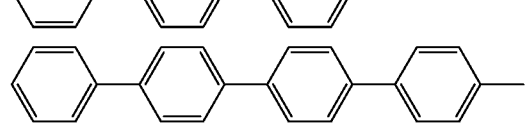

-continued
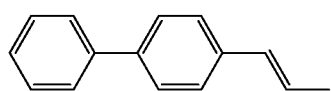
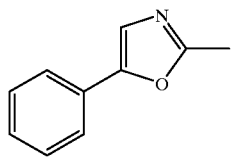
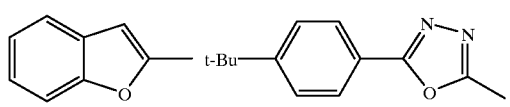
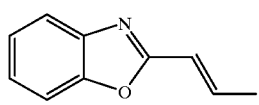
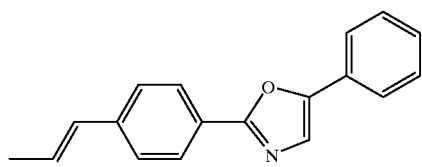
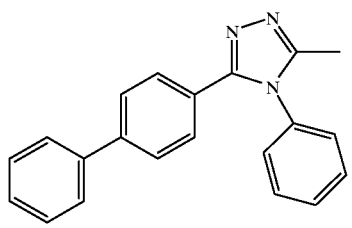
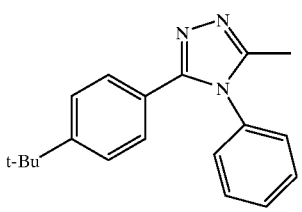
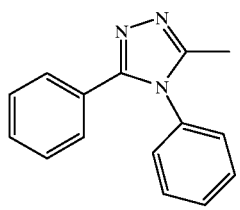
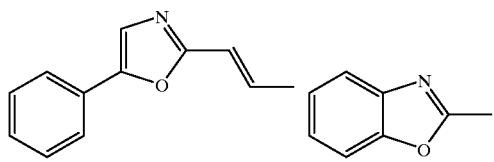
and Q, P¹ are identical or different and are selected from the group consisting of:
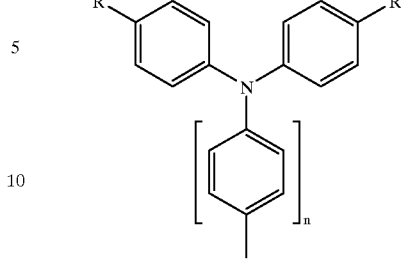
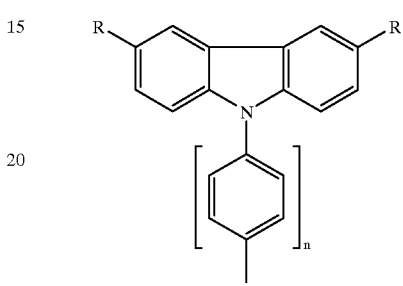
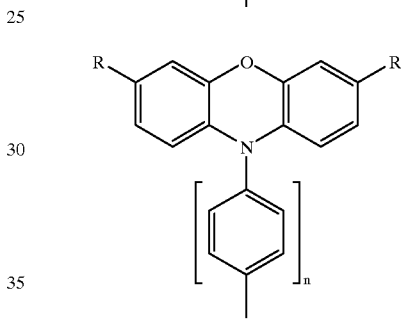
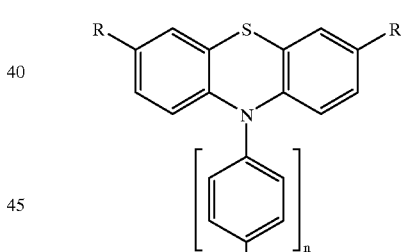
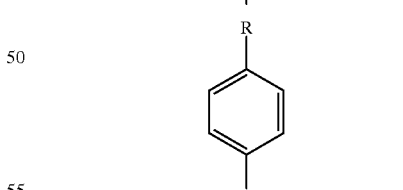
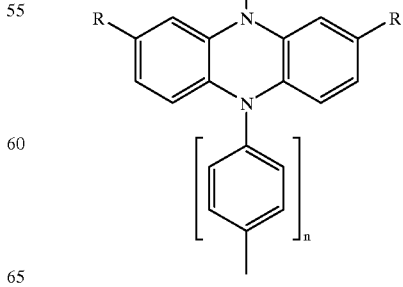

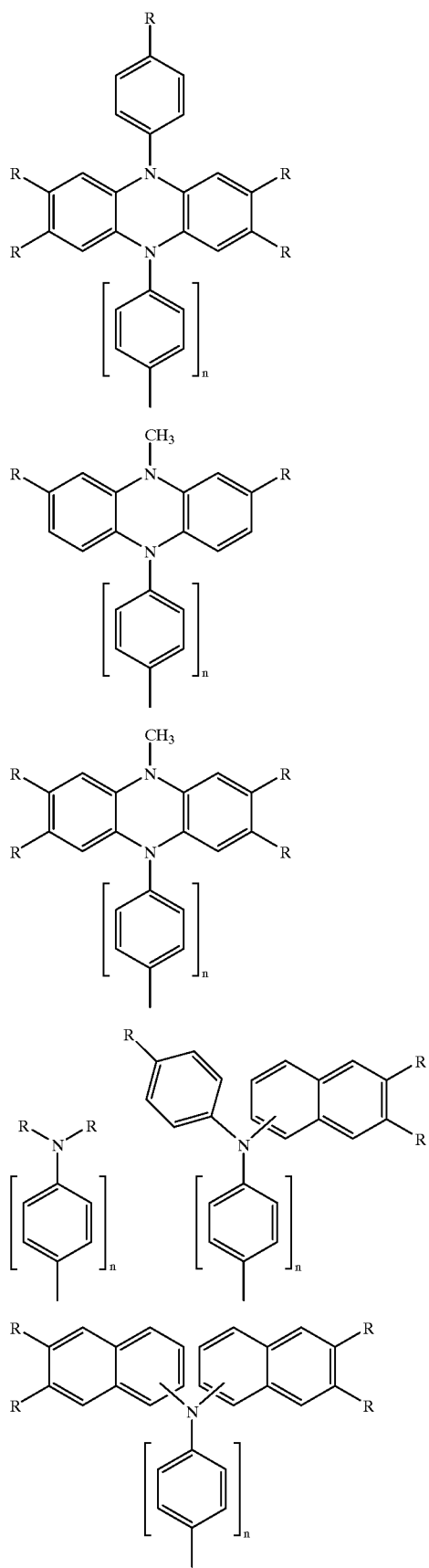
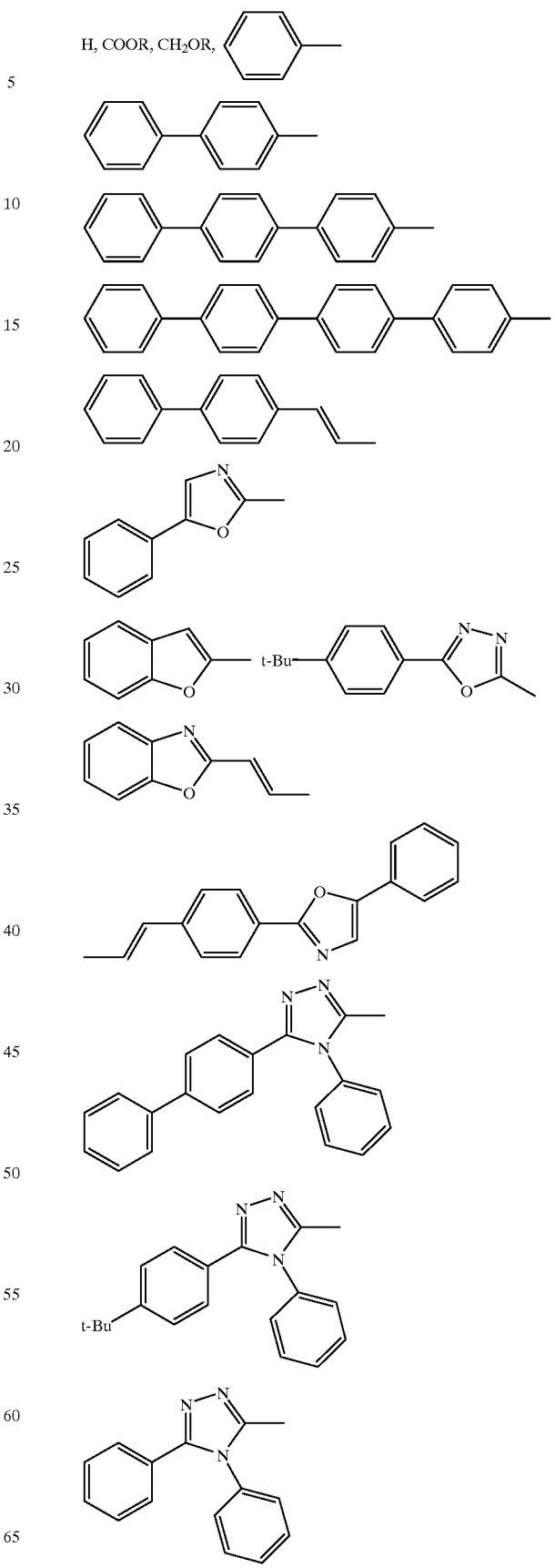

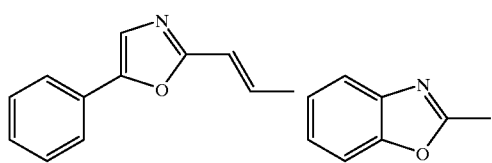
where the symbols and indices are as defined above.
5. A cell as claimed in claim 4 wherein the symbols in the formula (IV) have the following meanings:
IVaa) $K^1=L=M=N^1$ and is selected from the group consisting of:
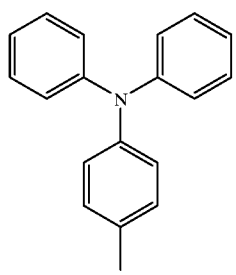
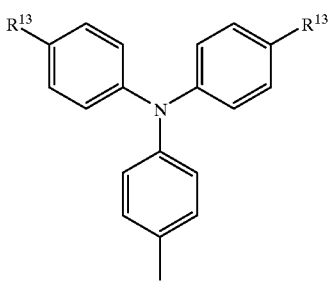
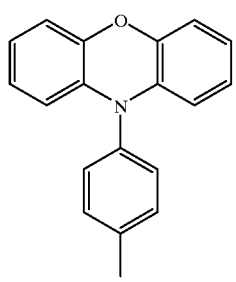
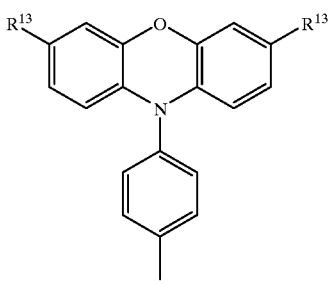
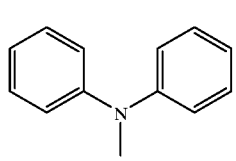
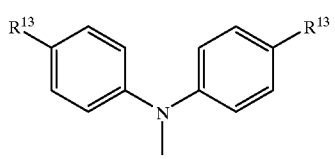
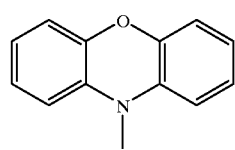
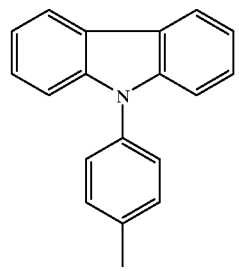
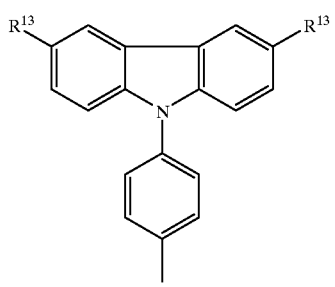
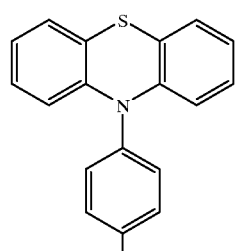
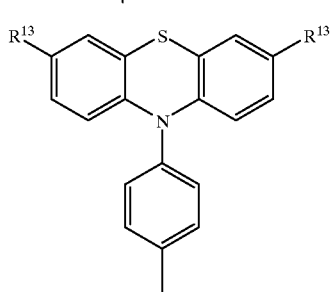

-continued
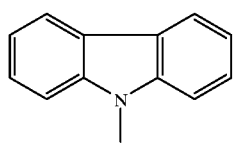
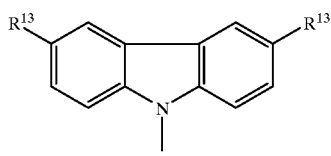
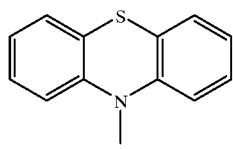
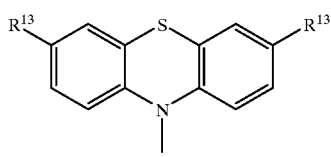
where R¹³ is —O—CH₃, —O—C₂H₅, —S—CH₃, —S—C₂H₅, preferably —O—CH₃, —S—CH₃, particularly preferably —O—CH₃;
and Q=P¹ and is selected from the group consisting of:
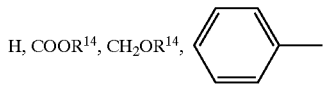
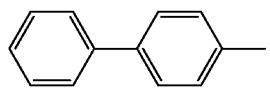
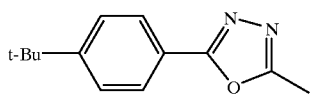
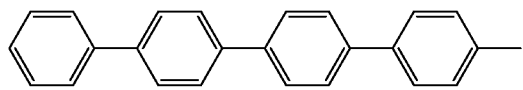
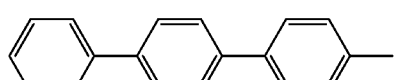
where $R^{14}$ is a straight-chain or branched alkyl group having from 1 to 12, preferably from 1 to 4, carbon atoms;
IV.ba) K¹=L=M=N¹=Q=P¹ and is selected from the group consisting of:
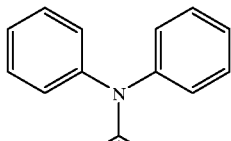
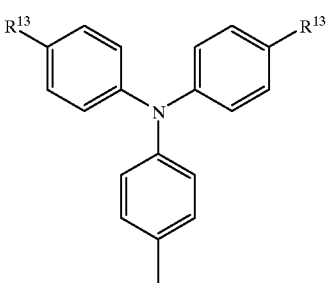
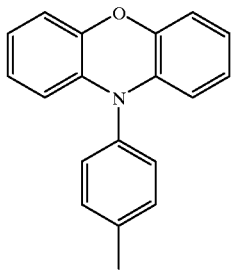
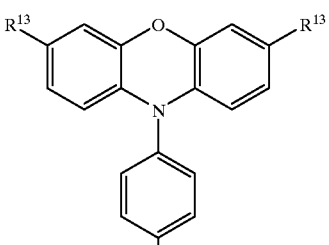
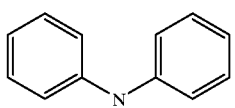
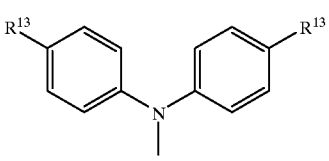
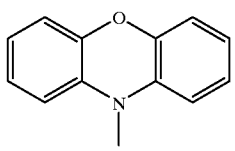

-continued
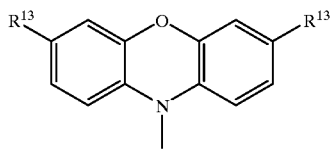
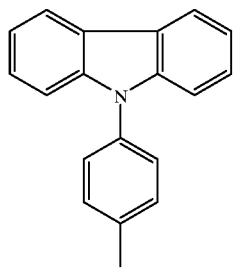
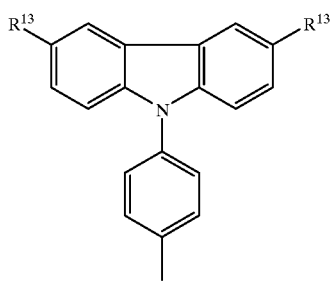
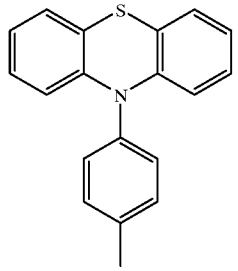
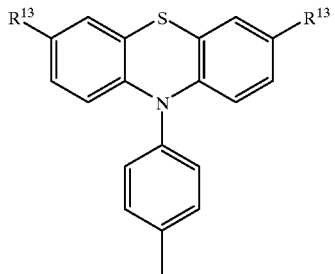
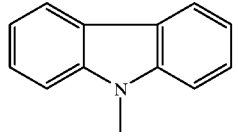
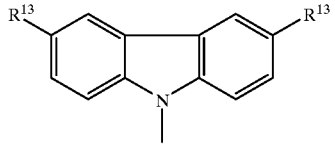
-continued
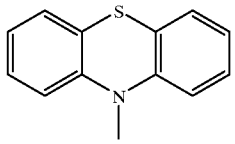
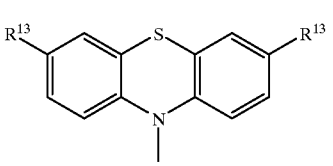
where $R^{13}$ is as defined above;
IV.ca) $K^1=L=M=N^1$ and is selected from the group consisting of:
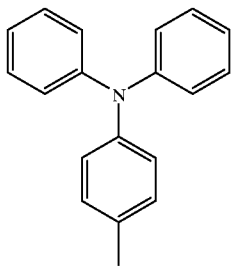
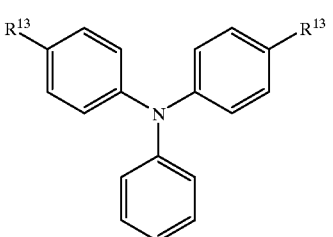
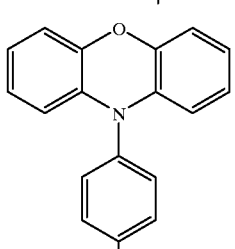
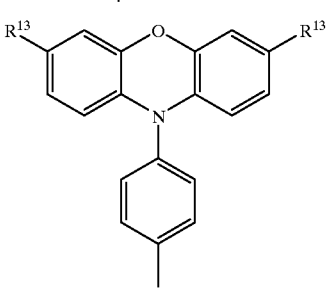

-continued
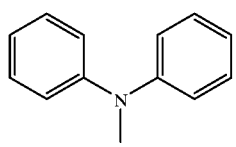
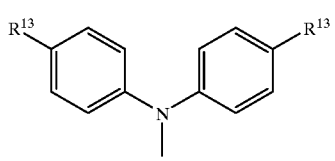
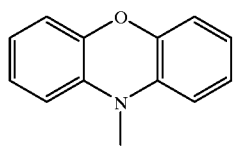
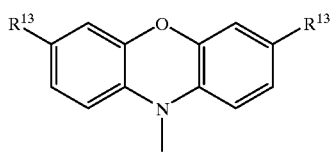
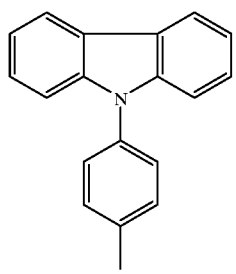
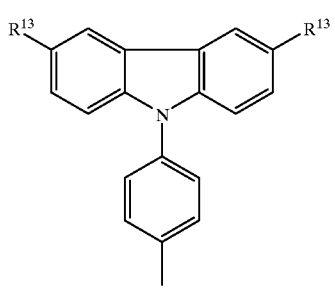
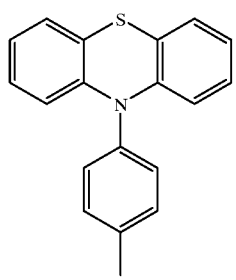
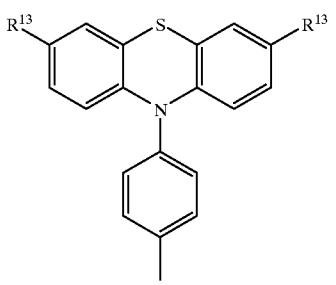
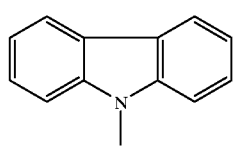
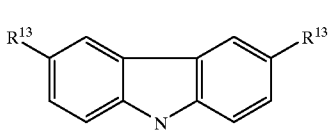
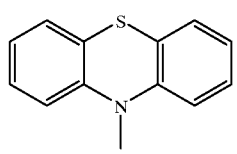
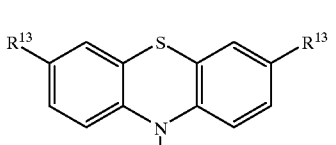
and Q=H and $P^1$ is selected from the group consisting of:
H, $COOR^{14}$, $CH_2OR^{14}$, 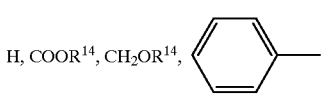
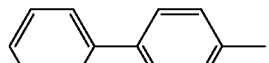
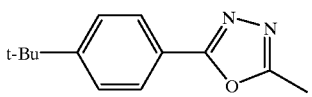
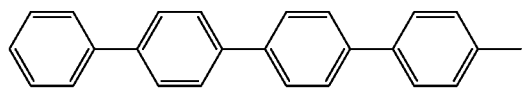
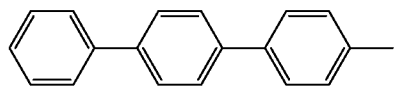
where $R^{13}$, $R^{14}$ are as defined above.

6. A cell as claimed in claim 1, wherein the anodic limiting potential of the electrolyte liquid (14) is equal to or above 2.5V.

7. A cell as claimed in claim 6, wherein the electrolyte liquid (14) comprises a compound selected from the group consisting of acetonitrile, glutarodinitrile, ethylene carbonate, propylene carbonate, chlorobenzene and 3-methyl-2-oxazilidinone.

8. A cell as claimed in claim 1, wherein the electrolyte (14) comprises a conductive salt.

9. A cell as claimed in claim 1, which has a light-absorbing layer (12) which comprises a semiconductor material having a band gap of at least 3 eV.

10. A photovoltaic cell as claimed in claim 9, wherein the semiconductor material (12) is a metal oxide.

11. A photovoltaic cell as claimed in claim 9, wherein the semiconductor surface (12) has a roughness factor of <20.

12. A photovoltaic cell as claimed in claim 1, which comprises a light-absorbing layer comprising a dye as sensitizer.

13. The use of a hole conductor compound of the formula (I) as claimed in claim 1 as redox system in an electrolyte liquid (14).

14. The use as claimed in 13, wherein the electrolyte liquid (14) is used in a photovoltaic cell (10).

* * * * *